(12) United States Patent
Enokida et al.

(10) Patent No.: US 8,985,929 B2
(45) Date of Patent: Mar. 24, 2015

(54) SUBSTRATE PROCESSING APPARATUS, SUBSTRATE PROCESSING METHOD AND STORAGE MEDIUM

(75) Inventors: Suguru Enokida, Koshi (JP); Masahiro Nakaharada, Koshi (JP); Akira Miyata, Koshi (JP); Hidekazu Kiyama, Koshi (JP); Naruaki Iida, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 173 days.

(21) Appl. No.: 13/611,555

(22) Filed: Sep. 12, 2012

(65) Prior Publication Data
US 2013/0078059 A1 Mar. 28, 2013

(30) Foreign Application Priority Data

Sep. 22, 2011 (JP) ................. 2011-208097
Sep. 22, 2011 (JP) ................. 2011-208100

(51) Int. Cl.
*H01L 21/677* (2006.01)
*H01L 21/67* (2006.01)
*H01L 21/687* (2006.01)

(52) U.S. Cl.
CPC .... *H01L 21/67178* (2013.01); *H01L 21/67745* (2013.01); *H01L 21/67766* (2013.01);
(Continued)

(58) Field of Classification Search
CPC ............ H01L 21/67178; H01L 21/68707; H01L 21/67781; H01L 21/67745; H01L 21/67769; H01L 21/67766
USPC ................ 414/805, 217, 937, 939
See application file for complete search history.

(56) References Cited

U.S. PATENT DOCUMENTS 6,034,000 A * 3/2000 Heyder et al. ............. 438/758
6,450,750 B1 * 9/2002 Heyder et al. ............. 414/217
(Continued)

FOREIGN PATENT DOCUMENTS

JP 2000-269304 A1 9/2000
JP 2003-007795 A1 1/2003
(Continued)

OTHER PUBLICATIONS

Japanese Office Action (Application No. 2011-208097) dated Feb. 4, 2014.
(Continued)

*Primary Examiner* — Kaitlin Joerger
(74) *Attorney, Agent, or Firm* — Burr & Brown, PLLC

(57) ABSTRACT

A substrate processing apparatus includes: a carrier block including first and second carrier placement units spaced apart in a right and left direction; a processing block having a layered structure in which a plurality of layered parts are vertically arranged, the layered parts each including a substrate transport mechanism for transporting a substrate and a processing module for processing a substrate; a tower unit including plural substrate placement units located at height positions where a substrate is transferred by the substrate transport mechanism of the layered part corresponding to the substrate placement unit; a first substrate transfer mechanism configured to transfer a substrate between the carrier on the first carrier placement unit and the substrate placement unit of the tower unit; and a second substrate transfer mechanism configured to transfer a substrate between the carrier on the second substrate placement unit and the substrate placement unit of the tower unit.

7 Claims, 25 Drawing Sheets

(52) U.S. Cl.
CPC .... *H01L21/67769* (2013.01); *H01L 21/67781* (2013.01); *H01L 21/68707* (2013.01); *Y10S 414/137* (2013.01); *Y10S 414/139* (2013.01)
USPC ............ 414/217; 414/805; 414/937; 414/939

(56) References Cited

U.S. PATENT DOCUMENTS

| | | | |
|---|---|---|---|
| 6,466,300 B1 | | 10/2002 | Deguchi |
| 8,408,158 B2 * | | 4/2013 | Akimoto et al. .............. 118/695 |
| 8,444,363 B2 * | | 5/2013 | Sakata et al. .................. 414/217 |
| 8,545,160 B2 * | | 10/2013 | Sakaue et al. ................. 414/217 |
| 2007/0089673 A1 | | 4/2007 | Matsuoka et al. |
| 2008/0138178 A1 * | | 6/2008 | Ferrara et al. .............. 414/217.1 |
| 2009/0120362 A1 * | | 5/2009 | Hamada ........................ 118/686 |
| 2010/0068009 A1 * | | 3/2010 | Kimura et al. ............. 414/217.1 |
| 2010/0212585 A1 * | | 8/2010 | Tsukinoki .................... 118/500 |
| 2011/0076117 A1 * | | 3/2011 | Iizuka ........................... 414/217 |
| 2011/0076120 A1 * | | 3/2011 | Itou ........................... 414/222.13 |
| 2011/0078898 A1 * | | 4/2011 | Ishida et al. .................... 29/771 |
| 2011/0135427 A1 * | | 6/2011 | Sakaue ......................... 414/217 |
| 2011/0188974 A1 * | | 8/2011 | Diamond ...................... 414/217 |
| 2011/0211936 A1 * | | 9/2011 | Minami ........................ 414/217 |
| 2012/0016516 A1 * | | 1/2012 | Machida ....................... 700/218 |
| 2012/0063765 A1 * | | 3/2012 | Hayashi et al. ................ 396/611 |
| 2012/0249990 A1 * | | 10/2012 | Nishimura et al. ............. 355/72 |
| 2012/0315113 A1 * | | 12/2012 | Hiroki ........................... 414/217 |
| 2013/0068324 A1 * | | 3/2013 | Furusho et al. ................ 137/544 |
| 2013/0078061 A1 * | | 3/2013 | Enokida et al. ........... 414/226.05 |

FOREIGN PATENT DOCUMENTS

| | | |
|---|---|---|
| JP | 2006-086308 A1 | 3/2006 |
| JP | 2007-115831 A1 | 5/2007 |
| JP | 2009-231626 A1 | 10/2009 |
| JP | 2009-260087 A1 | 11/2009 |
| JP | 2009-278027 A1 | 11/2009 |

OTHER PUBLICATIONS

Japanese Office Action (Application No. 2011-208100) dated Jan. 7, 2014.

* cited by examiner

SUBSTRATE PROCESSING APPARATUS, SUBSTRATE PROCESSING METHOD AND STORAGE MEDIUM

CROSS REFERENCE TO RELATED APPLICATIONS

This application is based upon and claims the benefits of priorities from the prior Japanese Patent Application No. 2011-208097 filed on Sep. 22, 2011 and Japanese Patent Application No. 2011-208100 filed on Sep. 22, 2011, the entire contents of which are incorporated herein by reference.

BACKGROUND OF THE INVENTION

1. Field of the Invention

The present invention relates to a substrate processing apparatus, a substrate processing method and a storage medium, in which a substrate is taken out from a carrier and processed.

2. Background Art

A photoresist process, which is one of semiconductor manufacturing processes, is performed by a substrate processing apparatus including a carrier block for holding a carrier accommodating a plurality of semiconductor wafers (hereinafter referred to as "wafers") and a processing block for processing a wafer sent from the carrier block.

The processing block is sometimes formed by vertically stacking unit blocks of a unit block for a coating process, which performs a coating process of various chemical liquids such as a resist, and a processing block for a developing process, which performs a developing process. In this case, there is provided a stacked stage group for sending a wafer to the respective unit blocks, on a rear side (processing-block side) of a movement path of a wafer transfer mechanism disposed on the carrier block. For example, JP2009-278027A discloses such a substrate processing apparatus that is constituted as a coating and developing apparatus.

In the above substrate processing apparatus, the unit blocks are stacked on one another as described above, in order to reduce a ratio of a floor area occupied by the substrate processing apparatus relative to a floor area of a clean room in which the substrate processing apparatus is installed. However, further reduction of this ratio is desired. In addition, in this substrate processing apparatus, a higher throughput is required, while prevention of lowering in throughput is required even when the wafer transfer mechanism of the carrier block has a trouble.

JP2009-260087A describes a substrate processing apparatus including a carrier block having two transfer mechanisms, and a processing block having two stacked unit blocks. Each of the transfer mechanisms accesses a stage disposed on an entrance of each unit block, and a wafer is transported between the carrier block and the unit block via the stage. However, the stage to which one transfer mechanism is accessible is limited to a stage of one unit block, and thus the above problem cannot be solved.

SUMMARY OF THE INVENTION

The present invention has been made in view of the above circumstances. The object of a first aspect of the present invention is to provide a technique that can improve a throughput, and can reduce a floor area occupied by a substrate processing apparatus. The object of a second aspect of the present invention is to provide a technique that can reduce a floor area occupied by a substrate processing apparatus.

A substrate processing apparatus in a first aspect of the present invention is a substrate processing apparatus including: a carrier block including a first carrier placement unit and a second carrier placement unit each for holding thereon a carrier capable of accommodating substrates, the first carrier placement unit and the second carrier placement unit being spaced apart from each other in a right and left direction when viewed from a front side of the carrier block; a processing block disposed on a rear side of the carrier block, the processing block having a layered structure in which layered parts are vertically arranged, and the layered parts each including a substrate transport mechanism configured to transport a substrate and a processing module configured to process a substrate; a tower unit located on a position between the first carrier placement unit and the second carrier placement unit when the carrier block is viewed from the side of the processing block, the tower unit including substrate placement units, and each substrate placement unit being located at a height position where a substrate is transferred by the substrate transport mechanism of one layered part corresponding to the substrate placement unit; a first substrate transfer mechanism configured to transfer a substrate between the carrier on the first carrier placement unit and the substrate placement unit of the tower unit, the first substrate transfer mechanism including a substrate holding member capable of advancing and retreating, and moving vertically and configured to hold a substrate; and a second substrate transfer mechanism configured to transfer a substrate between the carrier on the second substrate placement unit and the substrate placement unit of the tower unit, the second substrate transfer mechanism including a substrate holding member capable of advancing and retreating, and moving vertically and configured to hold a substrate.

In the substrate processing apparatus in the first aspect of the present invention, when one of the first substrate transfer mechanism and the second substrate transfer mechanism has a trouble, the other substrate transfer mechanism may be configured to transfer a substrate between the carrier on the carrier placement unit corresponding to the other substrate transfer mechanism and the substrate placement unit of the tower unit.

In the substrate processing apparatus in the first aspect of the present invention, tie first substrate transfer mechanism and the second substrate transfer mechanism may be controlled such that, while one of tie first substrate transfer mechanism and the second substrate transfer mechanism performs an operation for discharging an unprocessed substrate from the carrier so as to transfer the substrate to the substrate placement unit of the tower unit, the other substrate transfer mechanism performs an operation for receiving a processed substrate from the substrate placement unit of the tower unit so as to transfer the substrate to the carrier.

In the substrate processing apparatus in the first aspect of the present invention, the carrier block may further include another carrier placement unit arranged to be vertically aligned with at least one of the first carrier placement unit and the second carrier placement unit.

In the substrate processing apparatus in the first aspect of the present invention, the substrate transfer mechanism corresponding to at least one of the first carrier placement unit and the second carrier placement unit may include an upper substrate transfer mechanism and a lower substrate transfer mechanism, in order that the upper substrate transfer unit transfers a substrate to or from the upper carrier placement unit and the lower substrate transfer unit transfers a substrate to or from the lower carrier placement unit.

In the substrate processing apparatus in the first aspect of the present invention, a temporary carrier placement unit may be disposed on a lateral side of the lower carrier placement unit, a carrier transport mechanism located above the carrier block loading and unloading a carrier to or from the temporary carrier placement unit, and a carrier moving mechanism configured to move the carrier between the lower carrier placement unit and the temporary carrier placement unit may be disposed.

In the substrate processing apparatus in the first aspect of the present invention, the carrier block may further include a third carrier placement unit arranged to be vertically aligned with the first carrier placement unit, and a fourth carrier placement unit arranged to be vertically aligned with the second substrate transfer mechanism.

In the substrate processing apparatus in the first aspect of the present invention, concerning both of the first substrate transfer mechanism and the second substrate transfer mechanism, a plurality of carrier placement units may be arranged to be vertically aligned with each other.

A substrate processing method in a first aspect of the present invention is a substrate processing method including: in a substrate processing apparatus including: a carrier block in which a carrier capable of accommodating substrates is placed; a processing block disposed on a rear side of tie carrier block, the processing block having a layered structure in which layered parts are vertically arranged, and the layered parts each including a substrate transport mechanism configured to transport a substrate and a processing module configured to process a substrate; a tower unit located on a position between a first carrier placement unit and a second carrier placement unit which are spaced apart from each other in a right and left direction when the carrier block is viewed from the side of the processing block, the tower unit including substrate placement units, and each substrate placement unit being located at a height position where a substrate is transferred by the substrate transport mechanism of one layered part corresponding to the substrate placement unit; a first substrate transfer mechanism configured to transfer a substrate between the carrier on the first carrier placement unit and the substrate placement unit of the tower unit; and a second substrate transfer mechanism configured to transfer a substrate between the carrier on the second substrate placement unit and the substrate placement unit of the tower unit; placing a carrier on the first carrier placement unit or on the second carrier placement unit; taking out a substrate from the carrier on the carrier placement unit so as to transfer the substrate to the substrate placement unit of the tower unit, by means of the corresponding substrate transfer mechanism of the first substrate transfer mechanism and the second substrate transfer mechanism; receiving the substrate placed on the substrate placement unit of the tower unit so as to transport the substrate to the processing module by means of the substrate transport mechanism of the processing block, and processing the substrate in the processing module; transporting the processed substrate from the side of the processing block to the substrate placement unit of the tower unit; and transferring the processed substrate, by means of the first substrate transfer mechanism or the second substrate transfer mechanism, from the substrate placement unit of the tower unit to the carrier placed on the carrier placement unit corresponding to the substrate transfer mechanism.

In the substrate processing method in the first aspect of the present invention, when one of the first substrate transfer mechanism and the second substrate transfer mechanism has a trouble, the other substrate transfer mechanism may be configured to transfer the substrate between the carrier on the carrier placement unit corresponding to the other substrate transfer mechanism and the substrate placement unit of the tower unit.

In the substrate processing method in the first aspect of the present invention, one of the first substrate transfer mechanism and the second substrate transfer mechanism may perform an operation for discharging an unprocessed substrate from the carrier so as to transfer the substrate to the substrate placement unit of the tower unit, and during this operation, the other substrate transfer mechanism is configured to receive a processed substrate from the substrate placement unit of the tower unit so as to transfer the substrate to the carrier.

In the substrate processing method in the first aspect of the present invention, another carrier placement unit may be arranged to be vertically aligned with at least one of the first carrier placement unit and the second carrier placement unit, and a temporary carrier placement unit for holding a carrier is disposed on a lateral side of the lower carrier placement unit of the two vertically aligned carrier placement units; and the carrier may be transported from a carrier transport mechanism located above the carrier block to the temporary carrier placement unit, and then the carrier positioned on the temporary carrier placement unit is moved to the lower carrier placement unit by a carrier moving mechanism.

A non-transitory storage medium in a first aspect of the present invention, a storage medium storing a computer program to be used in a substrate processing apparatus including: a carrier block in which a carrier capable of accommodating substrates is placed; a processing block disposed on a rear side of the carrier block, the processing block having a layered structure in which layered parts are vertically arranged, and the layered parts each including a substrate transport mechanism and a processing module configured to process a substrate; and a tower unit located on a position between a first carrier placement unit and a second carrier placement unit which are spaced apart from each other in a right and left direction when the carrier block is viewed from the side of the processing block, the tower unit including substrate placement units, each substrate placement unit being located at a height position where a substrate is transferred by the substrate transport mechanism of one layered part corresponding to the substrate placement unit; wherein the computer program is configured to execute the substrate processing method according to any one of the substrate processing methods in the first aspect of the present invention.

According to the first aspect of the present invention, since substrate can be transported simultaneously from the carriers placed on each of the carrier placement units to the substrate placement unit by the first substrate transfer mechanism and the second substrate transfer mechanism, a throughput can be improved. In addition, according to the first aspect of the present invention, a distance between the tower unit and each carrier placement unit can be restrained from being elongated, whereby enlargement of the substrate processing apparatus can be prevented.

A substrate processing apparatus in a second aspect of the present invention is a substrate processing apparatus including: a carrier block in which carrier placement units are vertically arranged, each carrier placement unit for holding thereon a carrier capable of accommodating substrates; a processing block disposed on a rear side of the carrier block, the processing block having a layered structure in which layered parts configured to sequentially process a substrate are vertically arranged, and the layered parts each including a substrate transport mechanism configured to transport a substrate and a processing module configured to process a substrate; a tower unit including substrate placement units, each substrate placement unit being located at a height position where a substrate is transferred by the substrate transport mechanism of one layered part corresponding to the substrate placement unit; and a substrate transfer mechanism configured to transfer a substrate between the carrier on each of the carrier placement units and the substrate placement unit of the tower unit, and between the two substrate placement units included in the tower unit; wherein the substrate transfer mechanism includes a first substrate holding member exclusively used when a substrate is transferred between the carrier and the substrate placement unit, and a second substrate holding member exclusively used when a substrate is transferred between the substrate placement units of the tower unit.

In the substrate processing apparatus in the second aspect of the present invention, the first substrate holding member may be configured to hold a substrate such that the first substrate holding member comes into contact with a portion nearer to a center of a lower surface of the substrate than a peripheral portion thereof; the second substrate holding member may include a support portion disposed to surround at least a part of a circumference of a substrate, and a holding claw disposed on an inner peripheral edge of the support portion and configured to support a peripheral portion of a substrate from below; and the substrate placement unit to and from which a substrate is transferred by the second substrate holding member may include a placement plate for placing thereon a substrate, the placement plate having a cutout in an outer circumference thereof, through which the holding claw can pass.

In the substrate processing apparatus in the second aspect of the present invention, the substrate placement unit to and from which a substrate is transferred by the first substrate holding member may include an elevating member configured to vertically move a substrate to a position that does not planarly interfere with the first substrate holding member, such that a substrate can be transferred between the substrate placement unit and the first substrate holding member.

A substrate processing method in a second aspect of the present invention is a substrate processing method including: in a substrate processing apparatus including: a carrier block in which carrier placement units are vertically arranged, each carrier placement unit for holding thereon a carrier capable of accommodating substrates; a processing block disposed on a rear side of the carrier block, the processing block having a layered structure in which layered parts configured to sequentially process a substrate are vertically arranged, and the layered parts each including a substrate transport mechanism configured to transport a substrate and a processing module configured to process a substrate; a tower unit including substrate placement units, each substrate placement unit being located at a height position where a substrate is transferred by the substrate transport mechanism of one layered part corresponding to the substrate placement unit; and a substrate transfer mechanism configured to transfer a substrate between the carrier on each of the carrier placement units and the substrate placement unit of the tower unit, and between the two substrate placement units included in the tower unit; taking out a substrate from the carrier on each of the carrier placement units so as to transfer the substrate to the substrate placement unit of the tower unit by means of a first substrate holding member of the substrate transfer mechanism; receiving the substrate on the substrate placement unit so as to transport the substrate to the processing module by means of the corresponding substrate transport mechanism in the processing block, and processing the substrate in the processing module; transporting the processed substrate to the substrate placement unit of the tower unit by means of the substrate transport mechanism; receiving the substrate placed on the substrate placement unit so as to transfer the substrate to another substrate placement unit of the tower unit corresponding to a layered part where a succeeding process is performed, by means of a second holding member different from the first holding member of the substrate transfer mechanism; and receiving the substrate on another substrate placement unit so as to transport the substrate to the processing module by means of the substrate transport mechanism of the layered part where the succeeding process is performed, and processing the substrate in the processing module.

In the substrate processing method in the second aspect of the present invention, the first substrate holding member may be configured to hold a substrate such that the first substrate holding member comes into contact with a portion nearer to a center of a lower surface of the substrate than a peripheral portion thereof; the second substrate holding member may include a support portion disposed to surround at least a part of a circumference of a substrate, and a holding claw disposed on an inner peripheral edge of the support portion and configured to support a peripheral portion of a substrate from below; and the substrate placement unit to and from which a substrate is transferred by the second substrate holding member may include a placement plate for placing thereon a substrate, the placement plate having a cutout in an outer circumference thereof, through which the holding claw can pass.

In the substrate processing method in the second aspect of the present invention, the substrate placement unit to and from which a substrate is transferred by the first substrate holding member may include an elevating member configured to vertically move a substrate to a position that does not planarly interfere with the first substrate holding member, such that a substrate can be transferred between the substrate placement unit and the first substrate holding member.

A non-transitory storage medium in a second aspect of the present invention is a storage medium storing a computer program to be used in a substrate processing apparatus including: a carrier block in which a carrier capable of accommodating substrates is placed; a processing block having a layered structure in which layered parts configured to sequentially process a substrate are vertically arranged, the layered parts each including a substrate transport mechanism and a processing module configured to process a substrate; and a tower unit including substrate placement units, each substrate placement unit being located at a height position where a substrate is transferred by the substrate transport mechanism of one layered part corresponding to the substrate placement unit; wherein the computer program is configured to execute the substrate processing method according to any one of the substrate processing methods in the second aspect of the present invention.

According to the second aspect of the present invention, the size of the substrate transfer mechanism can be reduced, whereby degree of freedom in layout of the positioning of the substrate transfer mechanism can be increased. In addition, degree of freedom in structure of the substrate placement unit can be increased. As a result, a floor area occupied by the apparatus can be restrained.

DETAILED DESCRIPTION OF THE INVENTION (First Embodiment)

Figure 1:
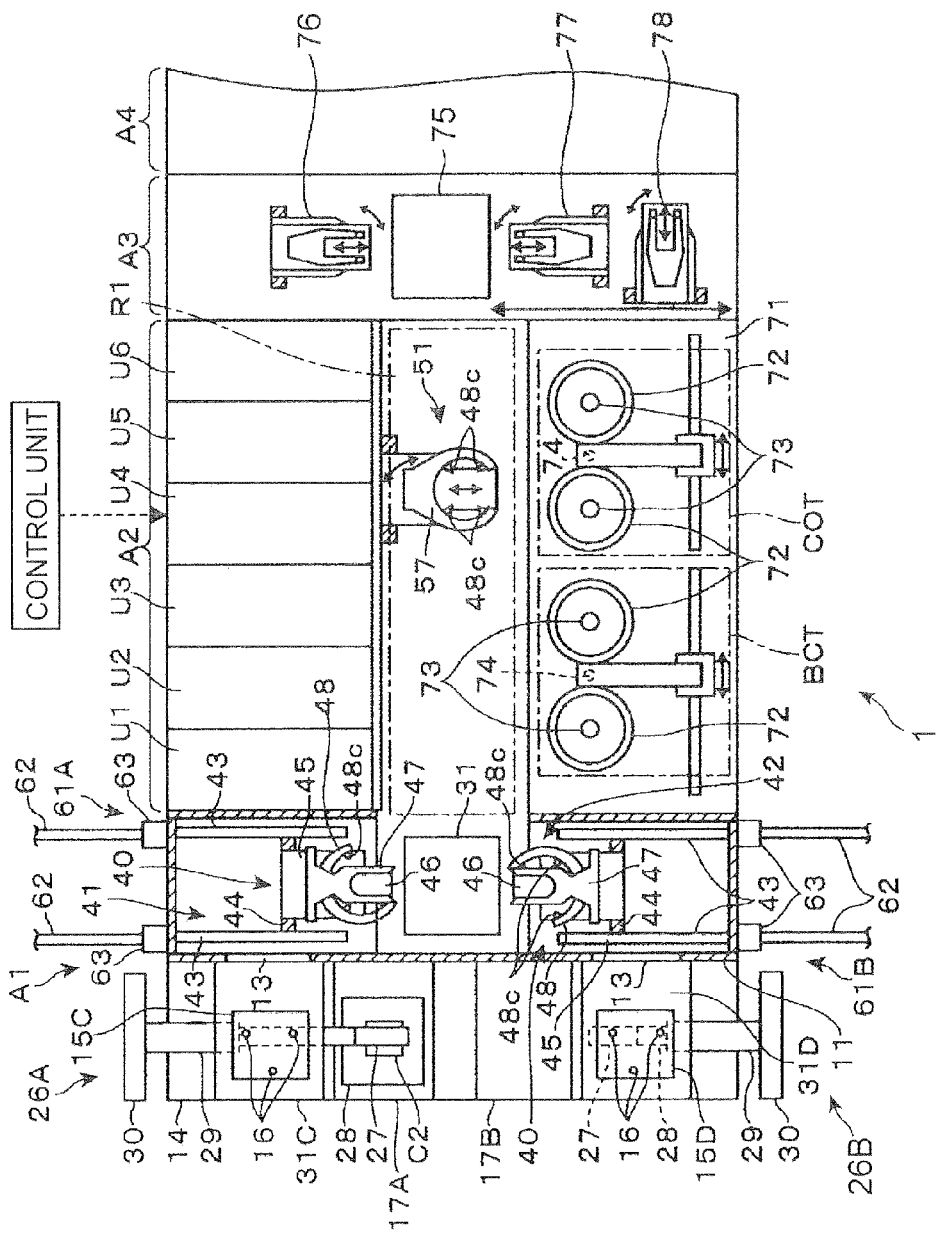
FIG. 1 is a plan view of a coating and developing apparatus according to a substrate processing apparatus of the present invention.
Figure 2:
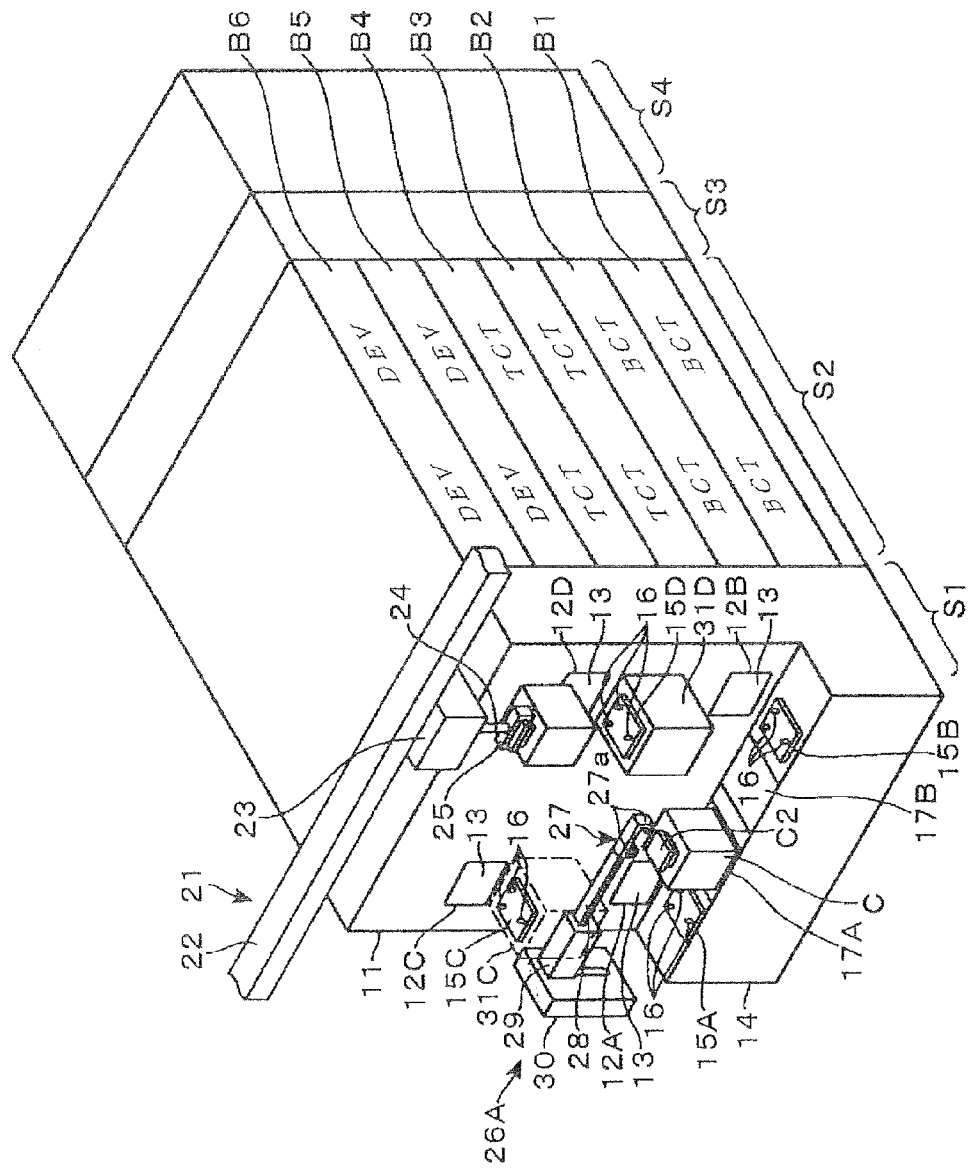
FIG. 2 is a perspective view of the coating and developing apparatus.
Figure 3:
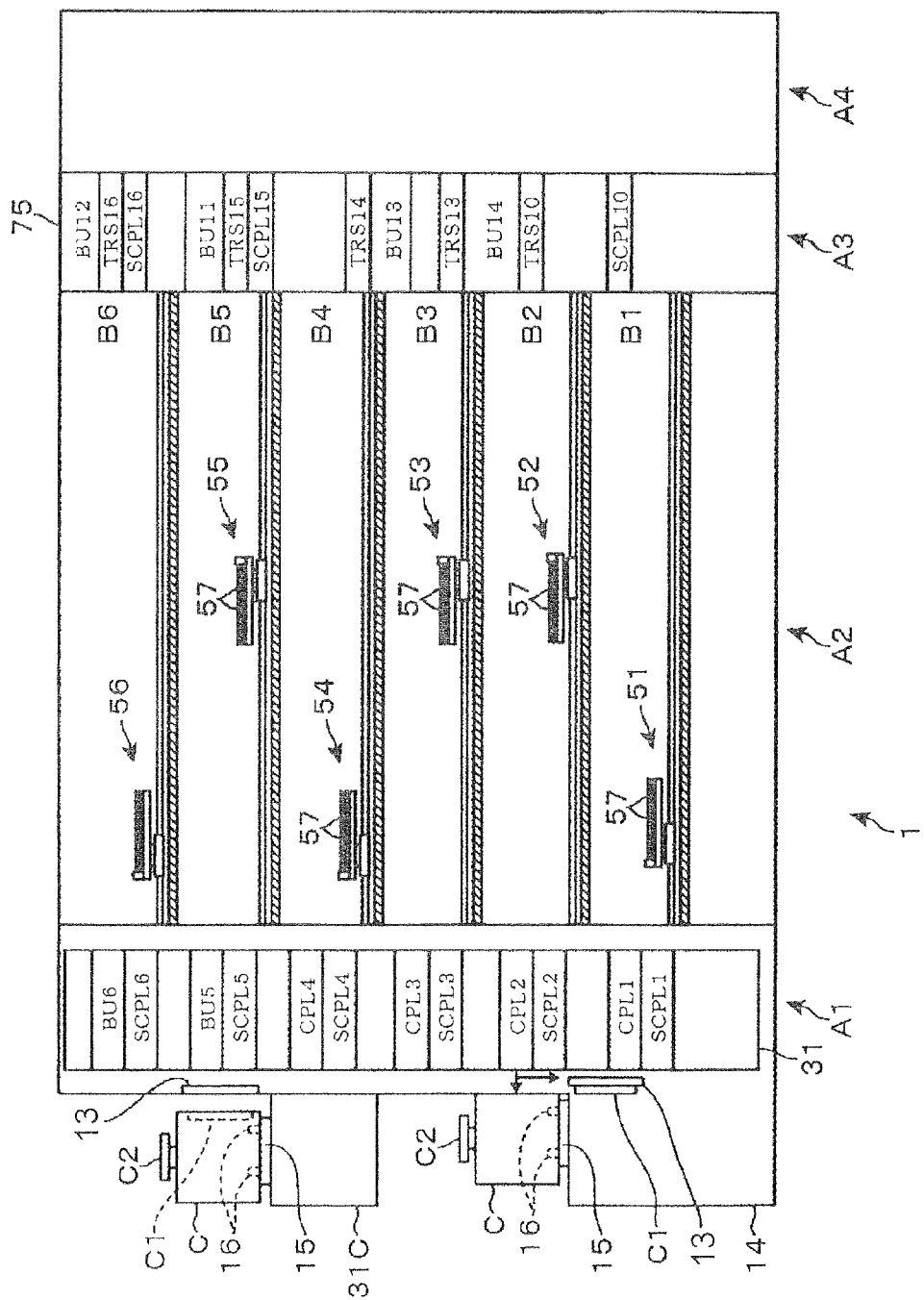
FIG. 3 is a longitudinal sectional view of the coating and developing apparatus.

A first embodiment of the present invention will be firstly described. In the first embodiment, a substrate processing apparatus is constituted as a coating and developing apparatus 1. The coating and developing apparatus 1 is connected to an exposure apparatus, so as to form a resist-pattern formation system. FIG. 1 is a plan view of the resist-pattern formation system, FIG. 2 is a schematic perspective view thereof, and FIG. 3 is a schematic side view thereof. The coating and developing apparatus 1 is constituted by linearly connecting a carrier block A1, a processing block A2 and an interface block A3. An exposure apparatus A4 is further connected to the interface block A3 on a side opposed to the processing block A2. In this example, under conditions where a space between an exposure lens and a wafer W as a substrate is in a gas phase, the exposure apparatus A4 exposes the wafer W. The coating and developing apparatus 1 includes a processing module corresponding to such an exposure apparatus A4. A place where a wafer is placed is referred to as "module", and a module in which a wafer W is subjected to various processes such as a liquid process and a heating process is referred to as "processing module".

In the below description, a direction along which the blocks A1 to A4 are arranged is referred to as "back and forth direction". A side of the carrier block A1 is referred to as "front side" and a side of the exposure apparatus A4 is referred to as "rear side". The processing block A2 is schematically described in the first place. The processing block A2 is composed of six unit blocks B1 to B6 which are stacked in this order from below. As shown in FIG. 3, the unit blocks B1 to B6 are respectively provided with main wafer transport mechanisms 51 to 56 as substrate transport mechanism for unit lock. The main wafer transport mechanisms 51 to 56 are configured to transport a wafer W independently of each other and simultaneously, between processing modules disposed on the respective unit blocks.

In the unit blocks B1 and B2, a wafer W is subjected to an antireflection-film formation process and a resist-film formation process. In the unit blocks B3 and B4, the wafer W is subjected to an antireflection-film formation process in which an antireflection film is laminated above the resist film. In the unit blocks B5 and 56, the wafer W having been exposed by the exposure apparatus A4 is subjected to a developing process.

Next, the carrier block A1 is described. The carrier block A1 is configured to send and receive a carrier C accommodating a plurality of wafers W, which is called FOUP, to and from a ceiling transport mechanism 21 shown in FIG. 2. In addition, the carrier block A1 has a function for transferring the wafers W between the carrier C and the processing block A2, and a function for vertically transporting the wafers W such that the wafers W are transferred between the different unit blocks B.

The carrier block A1 includes a cuboid housing 11. Four transport openings 12A to 12D for wafer W in communication with an inside of the housing 11 are formed in a front surface of the housing 11. The transport openings 12A and 12B are formed in a lower part of the housing 11 at the same height with an interval therebetween in the right and left direction. The transport openings 12C and 12D are formed at the same height, above the transport openings 12A and 12B. Each of the transport openings 12A to 12D is closed by an opening and closing unit 13. The opening and closing unit 13 detaches a lid body C1 disposed on a front surface of the carrier C, and moves backward and downward from each of the transport openings 12A to 12D while holding the detached lid body C1, as shown in FIG. 3, so that the wafers W can be transported between the inside of the carrier C and the inside of the housing 11.

A part of the front surface of the housing 11 below the transport openings 12A and 12B is formed as a support platform 14 projecting forward. Thus, the housing 11 has an L-shape in side view. Carrier placement units 15A and 15B are provided so as to be apart from each other in the right and left direction, on an upper surface of the support platform 14. These carrier placement units 15A and 15B are disposed in front of the respective transport openings 12A and 125. The carrier placement units 15A and 15B can be moved in the back and forth direction between an unloading position located on a front side of the support platform 14, where the carrier C is sent and received, and a loading position located on a rear side of the support platform 14, where wafers W are discharged from the carrier C placed thereon. The reference number 16 in the drawings depicts a pin projecting upward from each of the carrier placement units 15A and 15B. The pin 16 is configured to be fit in a groove C3 (illustration thereof is omitted in this embodiment) cut in a bottom surface of the carrier C. Thus, a position of the carrier C with respect to the carrier placement unit 15 is restricted.

A space between the carrier placement units 15A and 15B on the upper surface of the support platform 14 is formed as temporary carrier placement units 17A and 17B. The temporary carrier placement units 17A and 17B are areas in which the carrier C is temporarily placed, in order that the carrier C is transferred between the ceiling transport mechanism 21 and the carrier placement units 15A and 15B. The temporary carrier placement unit 17A is located on a side of the carrier placement unit 15A, and the temporary carrier placement unit 17B is located on a side of the carrier placement unit 15B.

The ceiling transport mechanism 21 is briefly described. The reference number 22 in FIG. 2 depicts a guide rail extending on a ceiling of a clean room where the coating and developing apparatus 1 is installed. The reference number 23 depicts a driving mechanism configured to be moved along the guide rail 22. The reference number 24 is a connection unit connected to the driving mechanism 23, and configured to be extended downward by the driving mechanism 23. The reference number 25 depicts a gripping unit disposed on a lower end of the connection unit 24, and configured to grip a unit to be gripped C2 disposed on an upper part of the carrier C.

Carrier moving mechanisms 26A and 26B are provided on a right side and a left side of the support platform 14. The carrier moving mechanisms 26A and 26B are configured to transfer the carrier C between the temporary carrier placement units 17A and 17B and the carrier placement units 15A and 15B. In FIG. 2, the carrier moving mechanism 26B is omitted for easy understanding of the view. The carrier moving mechanism 26A is described with reference to FIG. 2. The carrier moving mechanism 26A includes a gripping unit 27, a rod 28 extending laterally from the griping unit 27, a rod moving mechanism 29 configured to laterally moving the rod 28, and an elevating mechanism 30 configured to elevate and lower the rod moving mechanism 29. The gripping unit 27 is provided with claw portions 27a and 27b. Since an interval between the claw portions 27a and 27b is changeable, the gripping unit 27 can grip and release the portion C2 to be gripped of the carrier C. Since the carrier moving mechanism 26B has the same structure as that of the carrier moving mechanism 26A, detailed description of the carrier moving mechanism 26B is omitted.

Upper support platforms 31C and 31D projecting forward from the housing 11 are disposed below the transport openings 12C and 12D and above the transport openings 12A and 12B. Carrier placement units 15C and 15D are disposed on upper surfaces of the upper support platforms 31C and 31D, respectively. The carrier placement units 15C and 15D have the same structure as that of the carrier placement units 15A and 15B. Between the carrier placement units 15C and 15D and the ceiling transport mechanism 21, the carrier C is directly transferred, without passing through the temporary placement units 17A and 17B. The upper support platforms 31C and 31D are separated from each other such that a space is formed therebetween. By utilizing the space, the carrier C is transferred between the aforementioned temporary carrier placement units 17A and 17B and the ceiling transport mechanism 21. Namely, the upper support platforms 31 C and 31D are located so as not to overlap with the temporary carrier placement units 17A and 17B.

As shown in FIG. 1, a vertically extending tower unit 31 is disposed on a central portion in the housing 11 in the right and left direction. The tower unit 31 includes a plurality of delivery modules which are stacked on one another. A wafer W is temporarily placed in the delivery module, in order that the wafer W is loaded into each unit block B and unloaded from each unit block B. In the housing 11, there are disposed a first wafer transfer unit 41 and a second wafer transfer unit 42, such that the tower unit 31 is sandwiched therebetween in the right and left direction. The first wafer transfer unit 41 is located on a position facing the carrier placement units 15A and 15C, and configured to transport a wafer W between the carriers C respectively placed on the carrier placement units 15A and 15C and the modules in the tower unit 31. The second wafer transfer unit 42 is located on a position facing the carrier placement units 15B and 15D, and configured to transport a wafer W between the carriers C respectively placed on the carrier placement units 15B and 15D and the modules in the tower unit 31. The position facing the carrier placement unit means a position where the below-described transfer unit body 40 disposed on the wafer transfer unit can send and receive a wafer W to and from the carrier C placed on this carrier placement unit.

Figure 4:
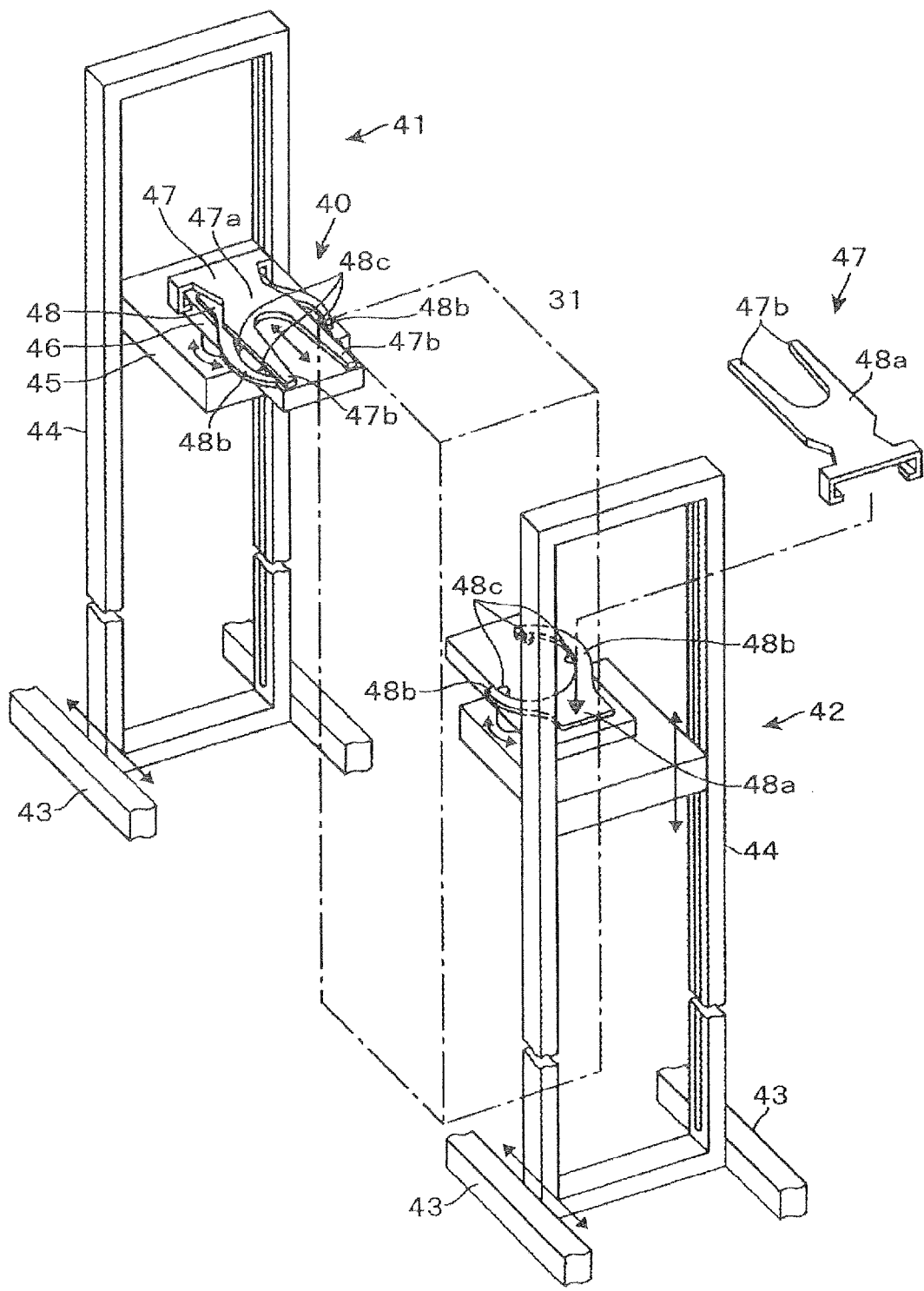
FIG. 4 is a perspective view of a wafer transfer mechanism disposed on a carrier block of the coating and developing apparatus.

The wafer transfer unit 41 is described with reference also to FIG. 4. The first wafer transfer unit 41 includes a guide rail 43, a support frame 44, and the transfer unit body 40. The guide rail 43 is laid on a bottom part of the housing 11 in the right and left direction. The support frame 44 is formed to vertically extend and is configured to be movable along the guide rail 43. The transfer unit body 40 is composed of an elevating base table 45, a rotating table 46, a first holding arm 47 and a second holding arm 48. The elevating base table 45 is supported by the support frame 44 and is configured to be vertically movable with respect to the support frame 44. The rotating table 46 is disposed on the elevating base table 45 and is configured to be rotatable about a vertical axis.

The first holding arm 47 as a substrate holding member has an elongated, flat fork shape including a proximal portion (base portion) 47a and two separated distal portions 47b and 74b extending horizontally from the proximal portion 47a. The first holding arm 47 is configured to be able to advance and retreat along its longitudinal direction above the rotating table 46. When the extending direction of the first holding arm 47 is supposed as a back and forth direction, the first holding arm 47 thus constituted above is configured to hold a portion of a lower surface of a wafer W, which portion is nearer to a central portion than a peripheral portion of the wafer W in the right and left direction (direction perpendicular to the extending direction). The first holding arm 47 is configured to be movable into the carrier C with the lid body C1 being opened, so as to send and receive a wafer W to and from the carrier C.

The second holding arm 48 as a substrate holding member is disposed below the first holding arm 47 so as to overlap with the first holding arm 47, above the rotating table 46. The second holding arm 48 is configured to be able to advance and retreat in the same direction as that of the first holding arm 47. The advancing and retreating operation of the second holding arm 48 can be performed independently of the first holding arm 47. The second holding arm 48 includes a proximal portion (base portion) 48a, two separated support portions (distal portions) 48b and 48b extending from the proximal portion 48a toward a forward moving direction (advancing direction) of the second holding arm 48 so as to surround a periphery of a wafer W, and three holding claws 48c disposed on lower inner peripheral edges of the respective support portions 48b and 48b. The one support portion 48b is longer than the other support portion 48b, and the proximal portion 48a and the support portions 48b and 48b together form substantially a C-shape in plan view. The holding claws 48c are spaced apart from each other, so as to hold a peripheral edge portion of a rear surface of a wafer W.

Figure 5:
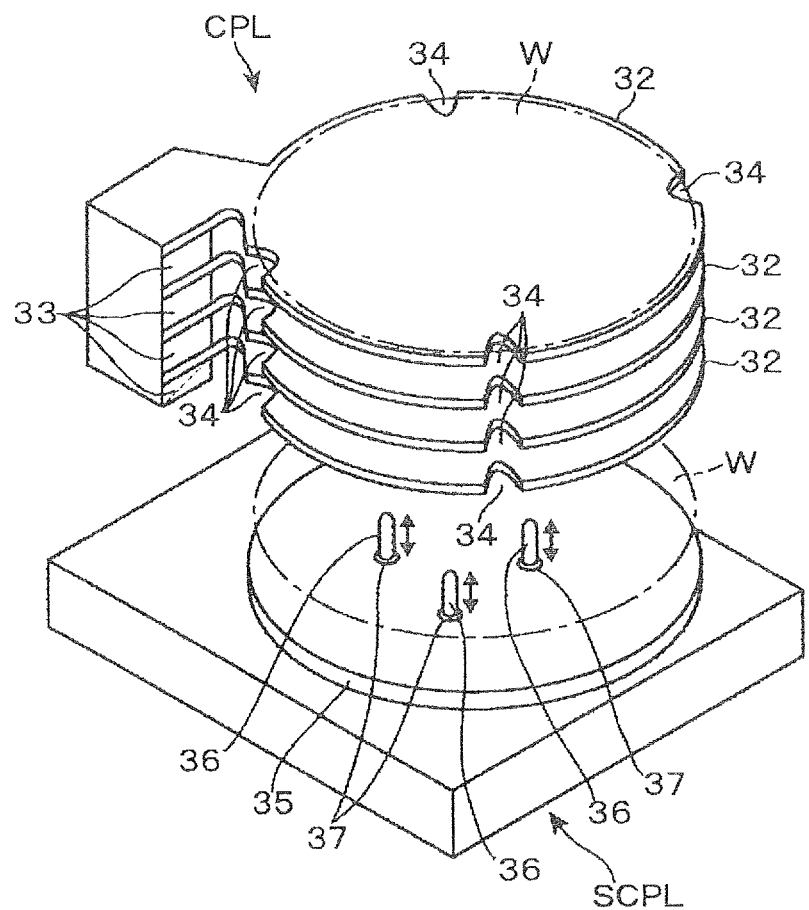
FIG. 5 is a perspective view of a delivery module disposed on the carrier block.

Next, a delivery module CPL and a delivery module SCPL as substrate placement units disposed in the tower unit 31 are described with reference to FIG. 5. Tie delivery module CPL includes a plurality of, e.g., four discoid wafer placement units which are stacked on one another with intervals therebetween. Wafers W can be placed on the respective placement units 32. A water flow path is formed in a rear surface of the wafer placement unit 32, so that a temperature of the wafer W placed on the wafer placement unit 32 is adjusted to a temperature of the water.

Figure 6:
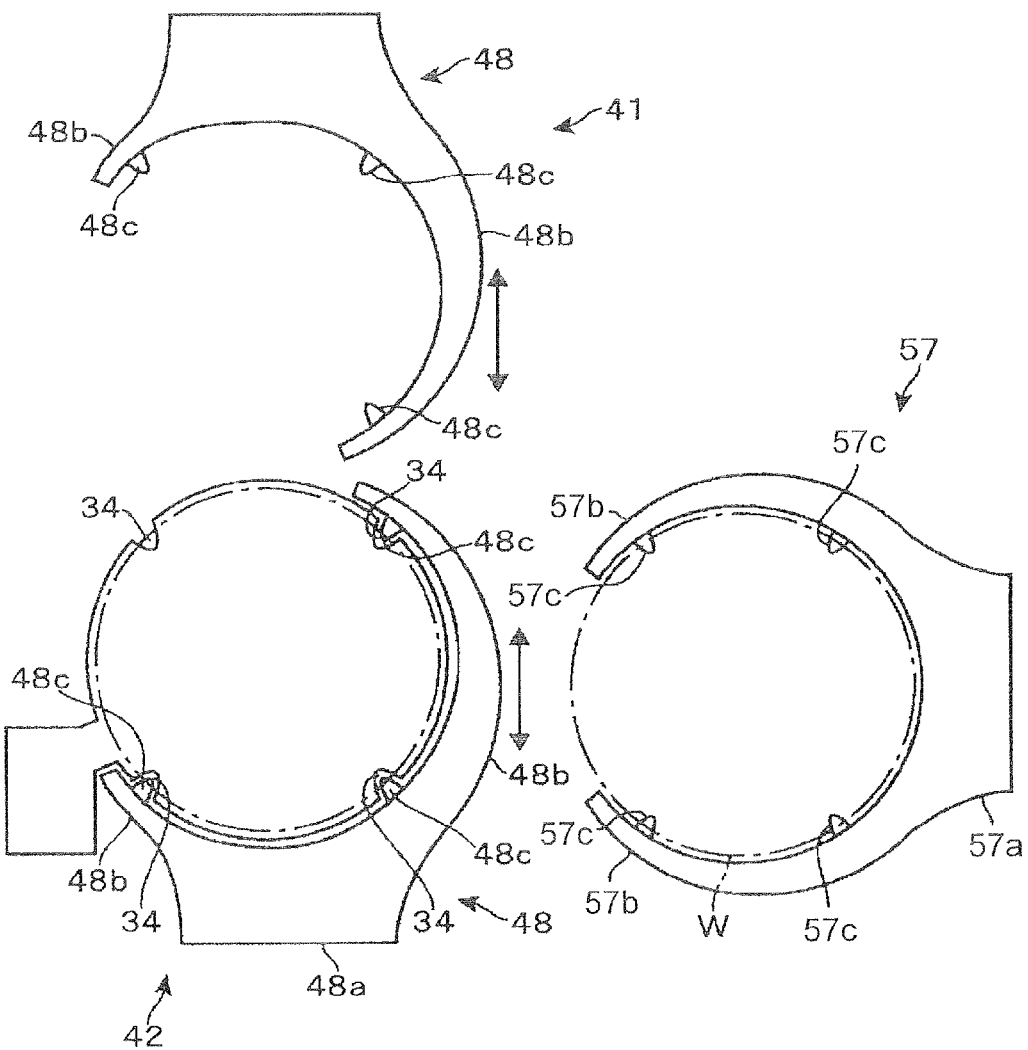
FIG. 6 is an explanatory view for explaining transfer of a wafer by the delivery module.

A part of a circumference of the wafer placement unit 32 projects outward, and this projecting portion constitutes a support unit 33 for supporting tie wafer placement unit 32. A plurality of inward cutouts 34 are formed in the circumference of the placement unit 32. When the second holding arm 48 of the wafer transfer units 41 and 42 are moved in tie up and down direction with respect to the wafer placement unit 32, the second holding arm 48 can pass near an outer circumference of the placement unit 32. At this time, as shown in FIG. 6 the holding claws 48c of the holding arm 48 pass through the cutouts 34. Thus, the wafer W can be transferred between the placement unit 32 and the holding arm 48.

The main wafer transport mechanisms 51 to 56 of the processing block A2 are described. The main wafer transport mechanisms 51 to 56 are of the same structure. Each of the main wafer transport mechanism 51 to 56 includes a holding arm (substrate holding member) 57 which is constituted substantially similarly to the second holding arm 48. Namely, the holding arm 57 of the main wafer transport mechanisms 51 to 56 includes a proximal portion (base portion) 57a, two separated support portions (distal portions) 57b and 57b extending from the proximal portion 57a toward a forward moving direction (advancing direction) of the holding arm 57 so as to surround a periphery of a wafer W, and holding claws 57c disposed on lower inner peripheral edges of the respective support portions 57b and 57b. The holding arm 57 of the main wafer transport mechanisms 51 to 56 differs from the holding arm 48 of the wafer transfer units 41 and 42 in that the two support portions (distal portions) 57b and 57b have the same length and that the number of the holding claws 57c is four. When the holding arm 57 is moved in the up and down direction with respect to the wafer placement unit 32, the holding arm 57 can pass near the outer circumference of the wafer placement unit 32, similarly to the second holding arm 48. At this time, the holding claws 57c of the holding arm 57 pass through the cutouts 34. Thus, the wafer W can be transferred between the delivery module CPL and the holding arm 57.

Return to FIG. 5, the delivery module SCPL is described. The delivery module SCPL includes a flat, circular placement unit 35 for wafer W. A not-shown flow path for cooling water is formed inside the wafer placement unit 35, so that a temperature of a wafer W placed on the wafer placement unit 35 is adjusted to a temperature of the cooling water. The temperature of the cooling water is adjusted by a chiller, and thus the delivery module SCPL can adjust the temperature of the wafer W placed thereon to a predetermined temperature more precisely than the delivery module CPL. Instead of supplying a cooling water, a thermo unit composed of, e.g., a Peltier element capable of controlling a temperature of a surface of the wafer placement unit 35 may be incorporated in the wafer placement unit 35.

Figure 7:
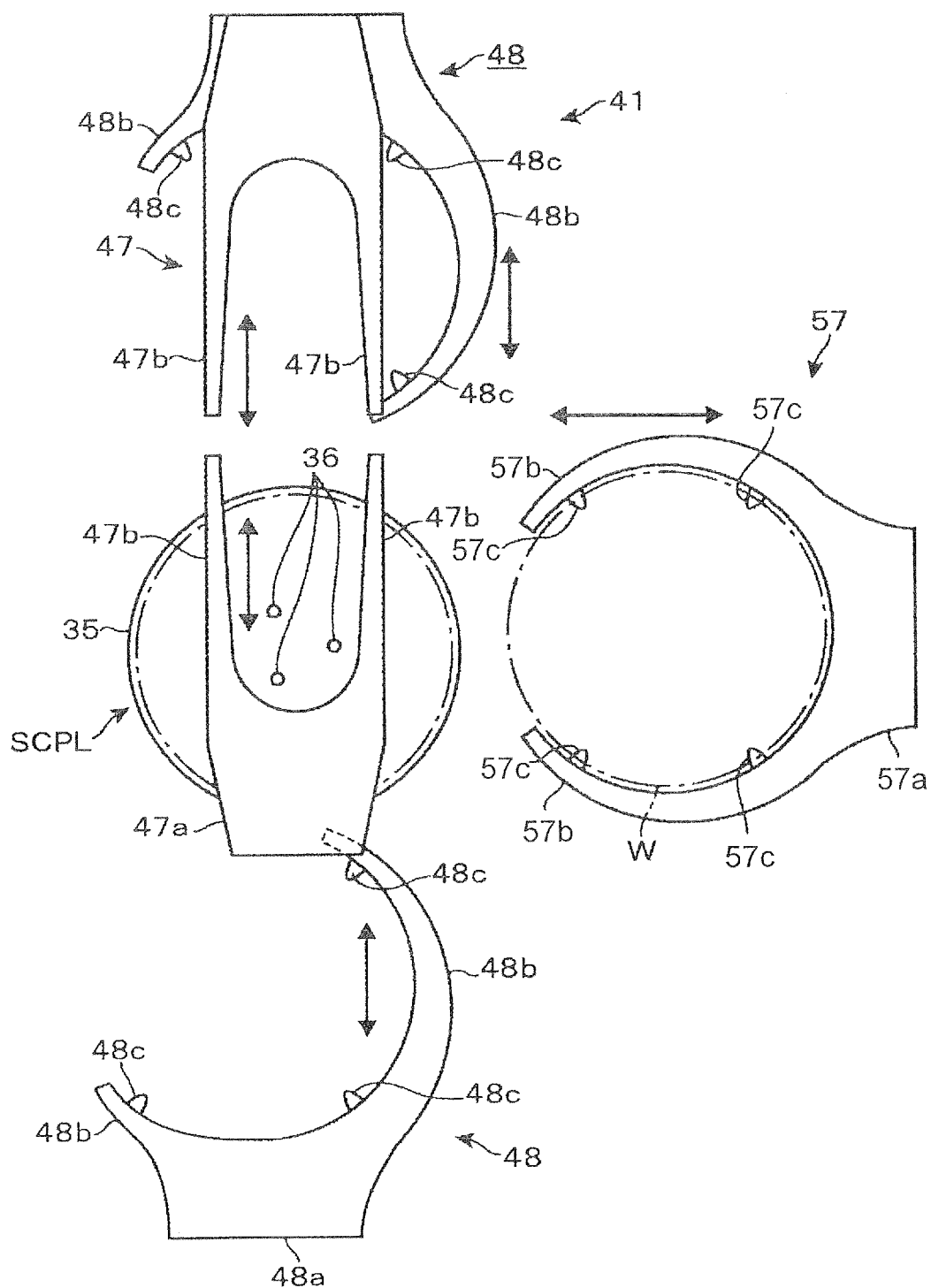
FIG. 7 is an explanatory view for explaining the transfer of a wafer by the delivery module.

The wafer placement unit 35 includes three elevating pins 36 as elevating members. The elevating pins 36 are configured to be projectable and retractable from the surface of the wafer placement unit 35 through three openings 37 opened in the surface of the wafer placement unit 35. As shown in FIG. 7, the elevating pins 36 are located to be passable through a space formed between the pair of supporting portions 47b of the first holding arm 47, a space formed between the pair of supporting portions 48b of the second holding arm 48, and a space formed between the pair of support portions 57b of the holding arm 57 of the main wafer transport mechanism, when the first holding arm 47, the second holding arm 48 and the holding arm 57 are located above the wafer placement unit 35, whereby a wafer W can be transferred between these holding arms 47, 48 and 57 and the placement unit 35. As a result, a wafer W can be transferred through the delivery modules SCPL and CPL between the first wafer transfer unit 41 and the second wafer transfer unit 42, and the main transport mechanisms disposed on the unit blocks located at heights corresponding to the delivery modules CPL and SCPL.

As shown in FIG. 3, in the tower unit 31, the delivery modules CPL and SCPL are located at respective height positions to which the main wafer transport mechanisms 51 to 54 of the unit blocks B1 to B4 are accessible, which are shown by the reference numbers CPL1 to CPL4 and SCPL1 to SCPL4. In addition, the delivery modules SCPL are located at height positions to which the main wafer transport mechanisms 55 and 56 of the unit blocks B5 and B6 are accessible, which are shown by the reference numbers SCPL5 and SCPL6.

Further, in the tower unit 31, buffer modules BU1 and BU2 are located at height positions to which the main wafer transport mechanisms 55 and 56 are accessible. These buffer modules BU1 and BU2 are constituted substantially similarly to the delivery module CPL. The buffer modules BU1 and BU2 can store a plurality of wafers W which are placed in the up and down direction. When a wafer W cannot be returned to the carrier C, the wafer W is transported to the buffer modules BU1 and BU2. For example, the buffer modules BU1 and BU2 are configured to store fifteen wafers W in total.

Figure 8:
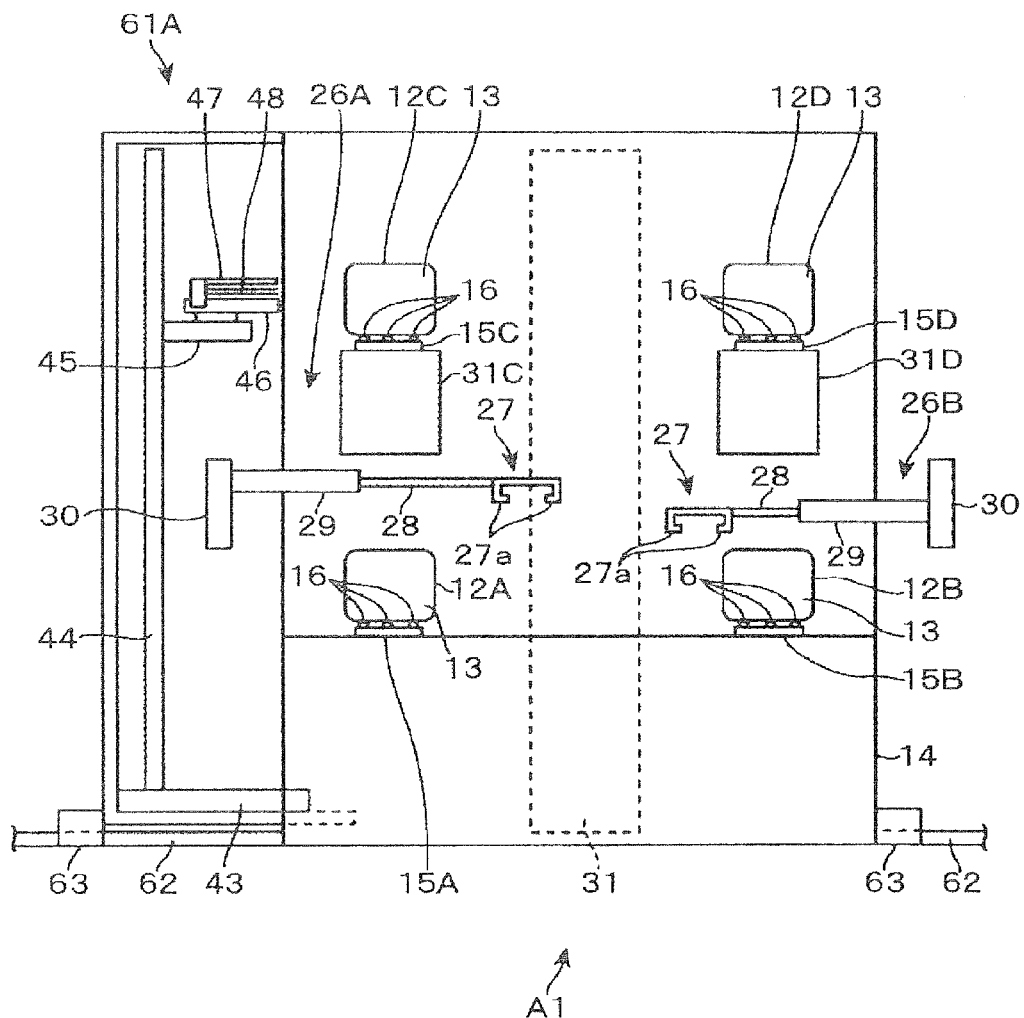
FIG. 8 is a front view of the carrier block in which a substrate transfer mechanism block that constitutes the carrier block is drawn out.
Figure 9:
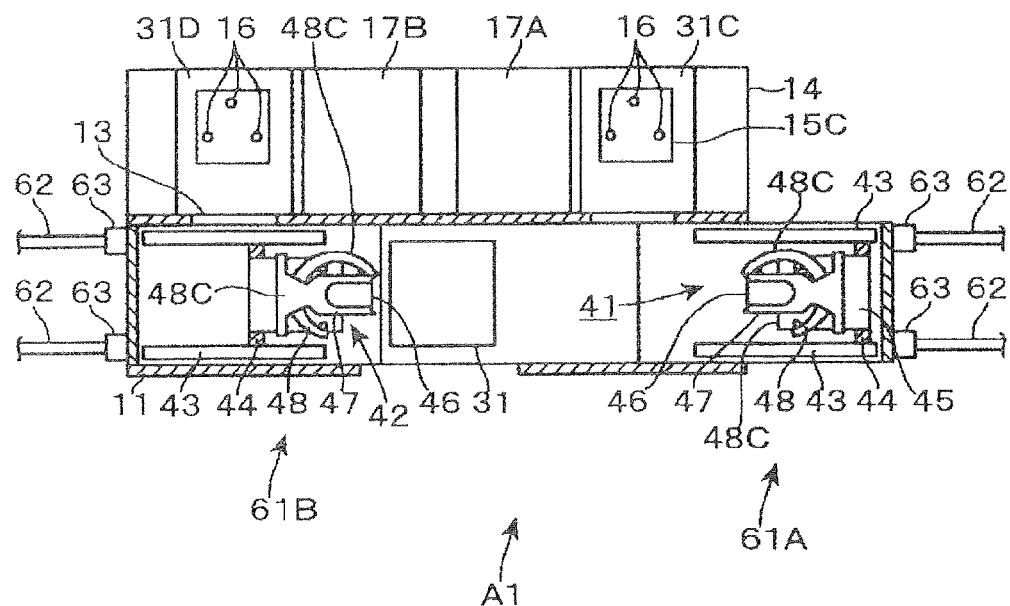
FIG. 9 is a plan view of the carrier block.

The housing 11 of the carrier block A1 is divided into a plurality of divided parts. One divided part is defined by a bottom surface part, a ceiling surface part and a side surface part opposed to the tower unit 31, which constitute an area where the first wafer transfer unit 41 is moved. This divided part and the first wafer transfer unit 41 is called wafer transfer unit block 61A. Another divided part is formed by a bottom surface part, a ceiling surface part and a side surface part opposed to the tower unit 31, which constitute an area where the second wafer transfer unit 42 is moved. This divided part and the second wafer transfer unit 42 is called wafer transfer unit block 61B. When viewed from the front of the carrier block A1, the wafer transfer unit blocks 61A and 61B can be drawn out in the right direction and in the left direction so as to separate from the tower unit 31, respectively. FIGS. 8 and 9 show that the wafer transfer unit block 61A is drawn out.

The reference number 62 in FIG. 8 depicts a guide rail extending in the right and left direction. The reference number in FIG. 8 depicts connection units respectively disposed outside the wafer transfer unit blocks 61A and 61B. The connection units 63 are configured to be slidable along the guide rail 62, so that the wafer transfer unit blocks 61A and 61B can be drawn out, as described above. Due to such a structure, the wafer transfer units 41 and 42 can be easily maintained. In addition, even when one of the wafer transfer units 41 and 42 is in operation, the other one can be maintained, whereby lowering of throughput can be prevented. In FIG. 2, illustration of the guide rail 62 and the connection units 63 is omitted.

Next, the first unit block B1 shown in FIG. 1 is described as a representative of the respective unit blocks of the processing block A2. When the processing block A2 is viewed from the front side toward the rear side, a transport area R1 extending from the tower unit 31 toward the interface block A3 is formed on a central portion of the processing block A2 in the right and left direction. The transport area R1 is a path where the main wafer transport mechanism 51 is moved. The main wafer transport mechanism 51 is moved in the transport area R1 so as to access the respective modules in the first unit block B1, the module in the aforementioned tower unit 31 which is located at a height corresponding to the first unit block B1, and a module in the below-described interface tower unit 75 which is located at a height corresponding to the first unit block B1. Shelf units U1 to U6 are arranged in the back and forth direction on the left side of the transport area R1. A liquid processing unit 71 is located on the right side of the transport area R1 opposed to the shelf units U1 to U6.

In the liquid processing unit 71, there are provided an antireflection-film formation module BCT and a resist-film formation module COT which are arranged in the back and forth direction. The antireflection-film formation module BCT includes two cups 72 each for processing a wafer W, two spin chucks 73 each for supporting a rear surface of the wafer W and rotating the wafer W about a vertical axis, and a chemical-liquid supply nozzle 74 commonly used for the two cups 72. A chemical liquid for forming an antireflection film is coated onto a wafer W by spin coating. The resist-film formation module COT is constituted similarly to the antireflection-film formation module CT, excluding that the chemical liquid is a resist. The shelf units U1 to U5 are formed by stacking heating modules for heating a wafer W at two levels, for example. The shelf unit U6 is formed by, e.g., two peripheral exposure modules stacked on each other.

The other unit blocks B2 to B6 are described. The unit block B2 is constituted similarly to the unit block B1. The unit blocks B3 and B4 are constituted similarly to the unit blocks B1 and B2, excluding that a heating module is disposed instead of the peripheral exposure module, and that a module TCT is disposed instead of the antireflection-film formation module BCT and the resist-film formation module COT, for supplying a chemical liquid different from those of the modules BCT and COT. In this example, a chemical liquid to be supplied by the module TCT to the wafer W is a chemical liquid for forming, above the resist film, an antireflection film or a resist protection film described below. The unit blocks B5 and 56 are constituted similarly to the unit blocks 53 and B4, excluding that a module of the liquid processing unit 71 is formed as a developing module DEV for supplying a developer.

Next, the interface block A3 is described. A vertically extending interface tower unit 75 is disposed on a central portion of the interface block A3 in the right and left direction. The interface tower unit 75 includes delivery modules TRS at positions corresponding to the unit blocks B3 to B6, which are shown by the reference symbols TRS13 to TRS16 in FIG. 3. The module shown by the reference symbol TRS is similar to the aforementioned module CPL, excluding that a cooling water is not circulated therein. Delivery modules SCPL and buffer modules BU are respectively disposed at positions corresponding to the unit blocks B5 and B6. The delivery modules SCPL are shown by the reference symbols SCPL15 and SCPL16, and the buffer modules BU are shown by the reference symbols BU11 and BU12.

Buffer modules BU13 and BU14 are disposed below the buffer modules BU11 and BU12. Each of the respective buffer modules BU of the interface block A3 has a function for temporarily storing a wafer W before exposure and after exposure. In addition thereto, the buffer modules BU11 and BU12 have a function for storing a wafer W when the wafer W cannot be returned to the carrier C, similarly to the buffer modules BU1 and BU2 of the tower unit 31. For example, the buffer modules BU11 and BU12 can store twenty-five wafers W, respectively. Further, the interface tower unit 75 is provided with delivery modules SCPI10 and TRS10 on a lower side thereof.

In the interface block A3, interface arms (interface substrate holding members) 76 and 77 are disposed such that the interface tower unit 75 is sandwiched therebetween in the right and left direction. The interface arms 76 and 77 are configured to transport a wafer W among the respective modules in the interface tower unit 75. An interface arm 78 is disposed below the interface arms 76 and 77, so as to transport a wafer W between the exposure apparatus A4 and the delivery modules SCPL10 and the TRS 10.

The coating and developing apparatus 1 is equipped with a control unit 70 formed of, e.g., a computer. The control unit 70 includes a data processing unit composed of a program, a memory and a CPU. The program incorporates instructions (respective steps) for transmitting control signals from the control unit 70 to the respective units of the coating and developing apparatus 1, such that a wafer W is transported and processed in the processing modules, which is described below. In addition, for example, the memory has an area into which values of processing parameters, such as a processing temperature, a processing time, a supply rate of each chemical liquid and an electric power value, are written. When the CPU executes the respective instructions of the program, these processing parameters are read out, and control signals corresponding to the parameter values are transmitted to the respective units of the coating and developing apparatus 1. The program (including a program relating to an input operation and a display of a processing parameter) is stored in a computer storage medium such as a flexible disc, a compact disc, a hard disc, an MO (magnetooptical disc) and a memory card, and installed in the control unit 70.

Transfer of the carrier C and a transport path of a wafer W discharged from the carrier C in the resist-pattern formation system are described. The carriers C are sequentially transferred from the ceiling transport mechanism 21 to the carrier placement units 15C and 16D located on the unloading positions and the temporary carrier placement units 17A and 17B. The carriers C having been transported to the temporary carrier placement units 17A and 17B are transferred respectively to the carrier placement units 15A and 15B by the carrier moving mechanisms 26A and 26B. The carrier placement units 15A to 15D on which the carriers C are placed are moved forward to the loading position, so that the front surfaces of the carriers C are pressed onto the front surface of the housing 11 of the carrier block A1. The opening and closing unit 13 detaches the lid body C1 of each of the carriers C, and the transport openings 12A and 12D are opened.

Figure 10:
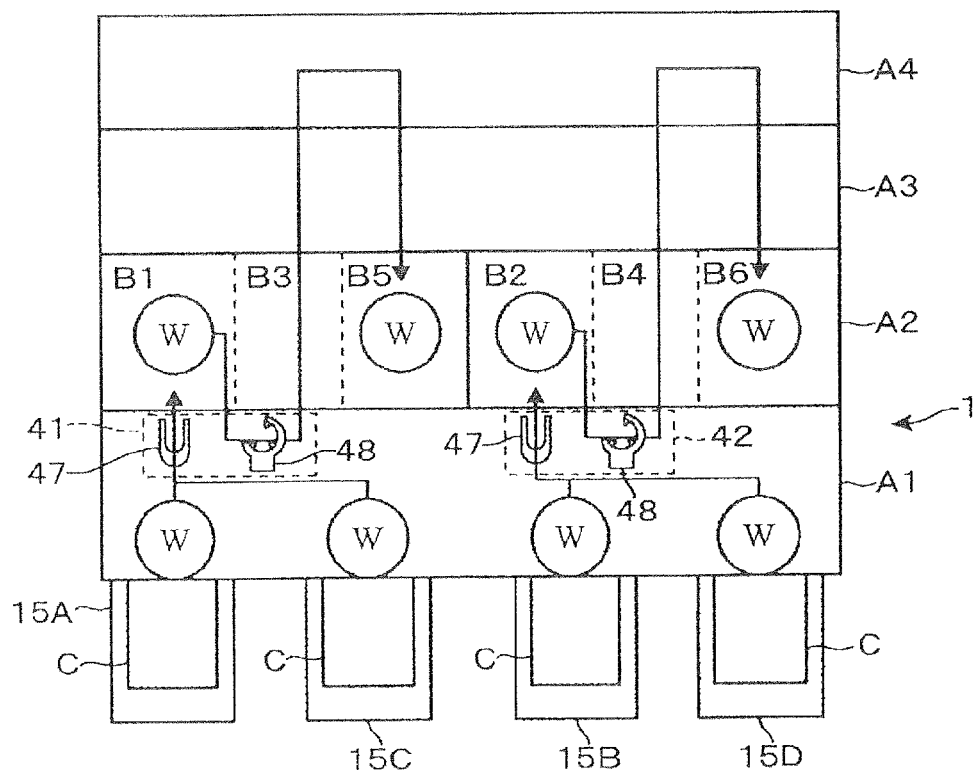
FIG. 10 is a schematic view of wafer transport paths in the coating and developing apparatus.
Figure 11:
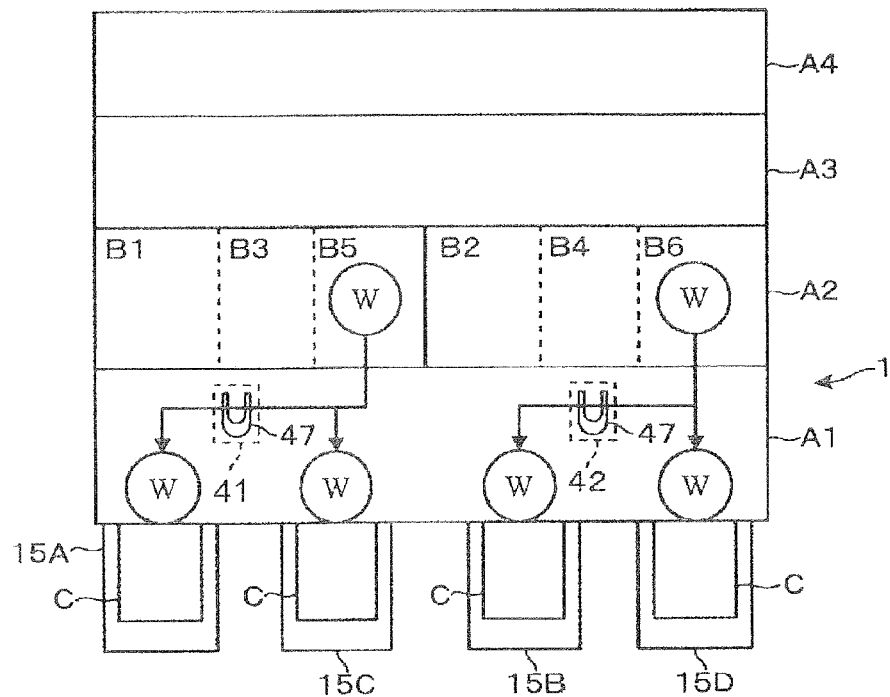
FIG. 11 is a schematic view of wafer transport paths in the coating and developing apparatus.

FIGS. 10 and 11 schematically show transport paths of wafers W, in a general condition of the system where the first wafer transfer unit 41 and the second wafer transfer unit 42 are available. FIGS. 10 and 11 show the holding arms (substrate holding members) used by the wafer transfer units 41 and 42 in the transport paths. As shown in FIG. 10, wafers W discharged from the carriers C placed on the carrier placement units 15A and 15C are processed by passing through the unit block B1, the unit block B3, the exposure apparatus A4 and the unit block B5. Wafers W discharged from the carriers C placed on the carrier placement units 15B and 15D are processed by passing through the unit block B2, the unit block B4, the exposure apparatus A4 and the unit block B6. As shown in FIG. 11, the respective wafers W having been processed in the unit blocks B5 and B6 are returned to the carriers C from which the wafers W have been discharged. The transport of the wafers W discharged from the carriers C on the carrier placement units 15A and 15C and the transport of the wafers W discharged from the carriers C on the carrier placement units 15B and 15D are performed simultaneously and independently of each other.

The first wafer transfer unit 41 of the carrier block A1 sequentially transports, by means of the first holding arm 47, the wafers W from one of the carriers C whose lid body has been firstly opened, on the carrier placement units 15A and 15C, to the delivery module SCPL1. After all the wafers W in this carrier C have been discharged therefrom, the first wafer transfer unit 41 sequentially transports, by means of the first holding arm 47, the wafers W in the succeeding (the other) carrier C, to the delivery module SCPL1, similarly to the above.

The wafer W whose temperature has been adjusted by the delivery module SCPL1 is taken into the first unit block B1 by the main wafer transport mechanism 51. The wafer W is transported to the antireflection-film formation module BCT, the heating module, the resist coating module COT, the heating module and the peripheral exposure module, in this order. After an antireflection film and a resist film have been sequentially laminated on a surface of the wafer W, the wafer W is loaded into the delivery module CPL1 of the carrier block A1.

The first wafer transfer unit 41 receives the wafer W in the delivery module CPL1 by means of the second holding arm 48, and sends the wafer W to the delivery module SCPL3. The wafer W whose temperature has been adjusted by the delivery module SCPL3 is taken into the third unit block B3 by the main wafer transport mechanism 53. The wafer W is transported by the main wafer transport mechanism 53 to the upper antireflection-film formation module TCT, the heating module and the delivery module TRS13 in this order. Thus, an antireflection film is formed above the resist film of the wafer W, and the wafer W is loaded into the interface block A3.

The wafer W is transported to the interface arm 76, the delivery modules BU11 to BU14, the interface arm 77, the delivery module SCPL 10, the interface arm 78 and the exposure apparatus 54 in this order, so as to be subjected to an exposure process. The exposed wafer W is transported to the interface arm 78, the delivery module TRS10, the interface arm 77, the buffer modules BU11 to BU14, the interface arm 76 and the delivery module TRS15 in this order.

The wafer W is taken into the fifth unit block B5 by the main wafer transport mechanism 55. The wafer W is transported to the heating module, the delivery module SCPL15, the developing module DEV, the heating module and the delivery module SCPL5 in this order. After the resist film has been developed, the wafer W is returned to the carrier block A1. The wafer W in the delivery module SCPL5 is returned to the carrier C in which the wafer W has been accommodated, by the first holding arm 47 of the first wafer transfer unit 41.

The wafers W discharged from the carriers C on the carrier placement units 15B and 15D are transported and processed similarly to the wafers W discharged from the carriers C on the carrier placement units 15A and 15C, excluding that the wafers are passed through the unit blocks different from above, that the wafers are transported to the delivery modules CPL and SCPL located at height positions corresponding to these unit blocks, and that the wafers are transported by the second wafer transfer unit 42 instead of the wafer transfer unit 41. To describe briefly, each of the wafers W in the carriers C on the carrier placement units 15B and 15D is transported to the delivery module SCPL2 by the first holding arm 47 of the second wafer transfer unit 42. Thereafter, the wafer W is transported to the antireflection-film formation module BCT, the heating module, the resist coating module COT, the heating module, the peripheral exposure module and the delivery module CPL2 in this order, by the main wafer transport mechanism 52 of the second unit block B2.

After that, the wafer W is transported from the delivery module CPL2 to the delivery module SCPL4 by the second holding arm 48 of the second wafer transfer unit 42. Then, the wafer W is transported to the upper antireflection-film formation module TCT, the heating module and the delivery module TRS14 in this order, by the main wafer transport mechanism 54 of the fourth unit block B4. The wafer W is transported similarly to the wafers W discharged from the carriers C on the wafer placement units 15A and 15C, by the interface arms 76 to 78. After being exposed, the wafer W is transported to the delivery module TRS16 via the buffer module BU. Following thereto, the wafers W is transported to the heating module, the delivery module SCPL16, the developing module DEV, the heating module and the delivery module SCPL6 in this order, by the main wafer transport mechanism 56 of the sixth unit block B6. Thereafter, the wafer W is returned to the carrier C in which the wafer W has been accommodated, by the first holding arm 47 of the second wafer transfer unit 42.

The carrier C into which all the wafers W have been returned is closed with the lid body C1 by the opening and closing unit 13, and the transport opening 12 opposed to the carrier C is closed. The carrier placement unit 15 on which the carrier C is placed is withdrawn to the unloading position. The carriers C placed on the carrier placement units 15C And 15D are directly transferred to the ceiling transport mechanism 21. The carriers C placed on the carrier placement units 15A and 15B are once transferred to the temporary placement units 17A and 17B by the carrier moving mechanism 26A and 26B and temporarily placed there, and thereafter the carriers are transferred to the ceiling transport mechanism 21. A succeeding carrier C is transferred from the ceiling transport mechanism 21 to the carrier placement unit 15 from which the carrier C has been transferred to the ceiling transport mechanism 21. In this manner, the wafers W are continuously processed in the resist-pattern formation system.

Figure 12:
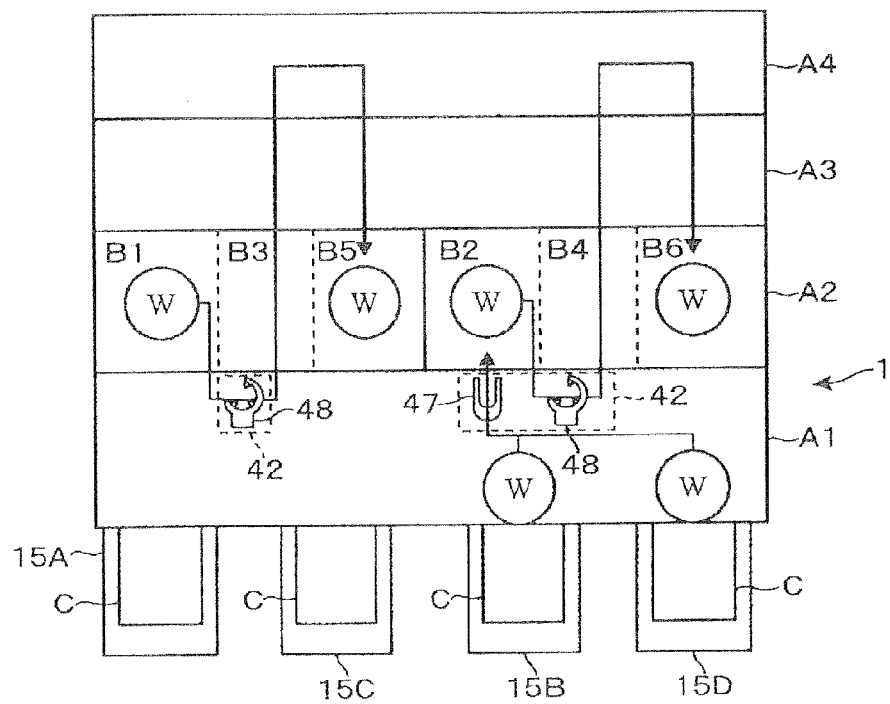
FIG. 12 is a schematic view of wafer transport paths in the coating and developing apparatus.
Figure 13:
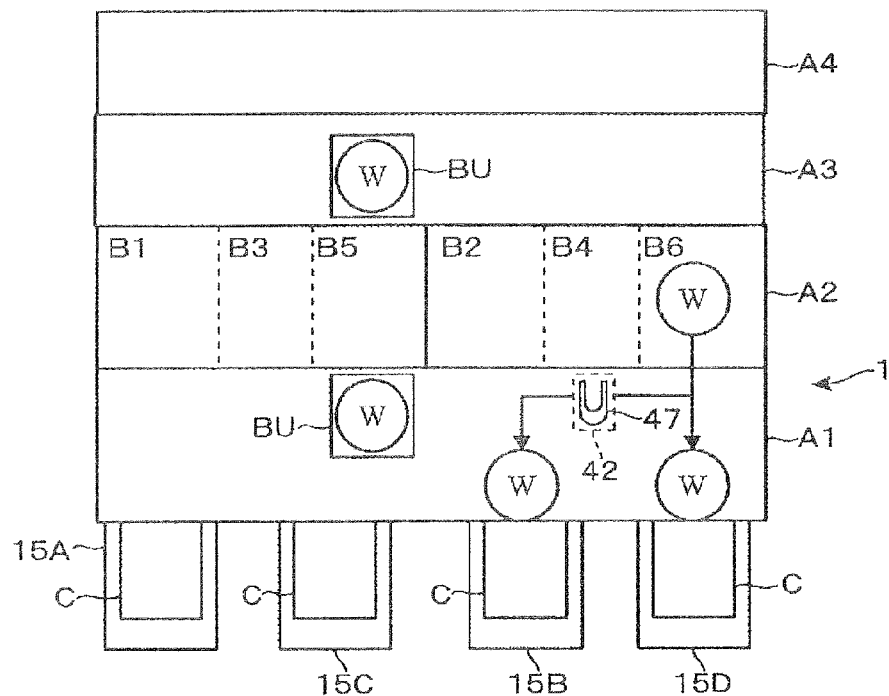
FIG. 13 is a schematic view of wafer transport paths in the coating and developing apparatus.

Next, transport paths of wafers W when the first wafer transfer unit 41 becomes unavailable in the course of transferring wafers W is described. FIGS. 12 and 13 are schematic views showing the transport paths of wafers W in this case. Transport of the wafers W in the carriers C placed on the carrier placement units 15B and 15D is performed similarly to the general condition. As shown in FIG. 12, unloading of wafers W in the carriers C on the carrier placement units 15A and 15C and loading of wafers W into these carriers C are stopped.

In the unit blocks B1, B3 and B5, wafers W having been already loaded into the respective unit blocks are transported substantially similarly to the general condition, until processing of the wafers W are finished in the respective processing modules of the unit block B5. Differently from the general transport condition, as shown in FIG. 12, the wafer W having been processed in the first unit block B1 and discharged to the delivery module CPL1 is transported, by means of the second holding arm 48 of the second wafer transfer unit 42, to the delivery module SCPL3 and is taken into the third block B3. Then, as shown in FIG. 13, the wafer W having been subjected to respective processes in the unit block B5 is transported to the buffer module BU1 or BU2 of the carrier block A1 or the buffer module BU11 or BU12 of the interface block A3 so as to be stored therein.

When the second wafer transfer unit 42 becomes unavailable, similarly to the case where the first wafer transfer unit 41 becomes unavailable, a wafer W having been processed in the unit block 136 is stored in the buffer module BU. Transport of a wafer W, which has been processed in the second unit block B2 and discharged to the delivery module CPL2, to the delivery module SCPL4 is performed by means of the second holding arm 48 of the first wafer transfer unit 41, and the wafer W is loaded into the fourth unit block B4. Then, the wafer W is processed similarly to the general condition. Wafers W in the buffer modules BU11 and BU12 may be collected by a user after the operation of the apparatus has been stopped, or after the unavailable wafer transfer unit 41 or 42 has become available, the wafers W may be returned to the carrier C by the wafer transfer unit 41 or 42.

In the coating and developing apparatus 1, under the general condition where the wafer transfer units 41 and 42 are available, a transport mode can be switched such that an unprocessed wafer W discharged from the carrier C on one of the carrier placement units 15A to 15D is transported to the carrier C placed on another carrier placement unit 15, after the wafer W has been processed. Herebelow, when a wafer W is transported in this manner, the carrier C for accommodating an unprocessed wafer W is referred to as a sender carrier SC, and the carrier for accommodating the processed wafer W is referred to as a receiver carrier RC.

Transport of a wafer W between the sender carrier SC and the receiver carrier RC is described with reference to FIGS. 14 and 15. Herein, the sender carriers SC are placed on the carrier placement units 15A and 15C, and the receiver carriers RC are placed on the carrier placement units 15B and 15D, with all the wafers W in the coating and developing apparatus 1 being discharged therefrom.

Figure 14:
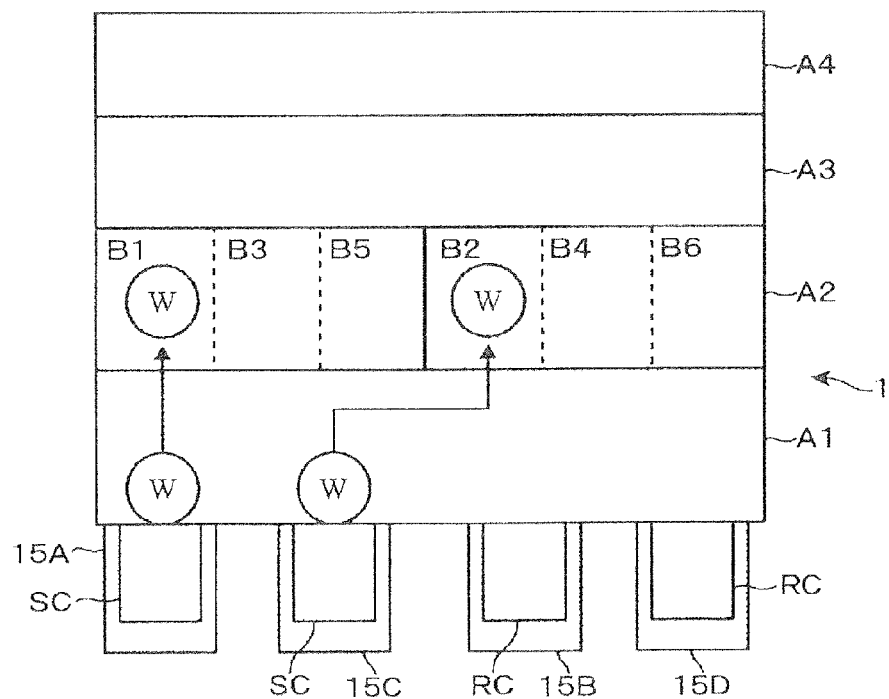
FIG. 14 is a schematic view of wafer transport paths in the coating and developing apparatus.
Figure 15:
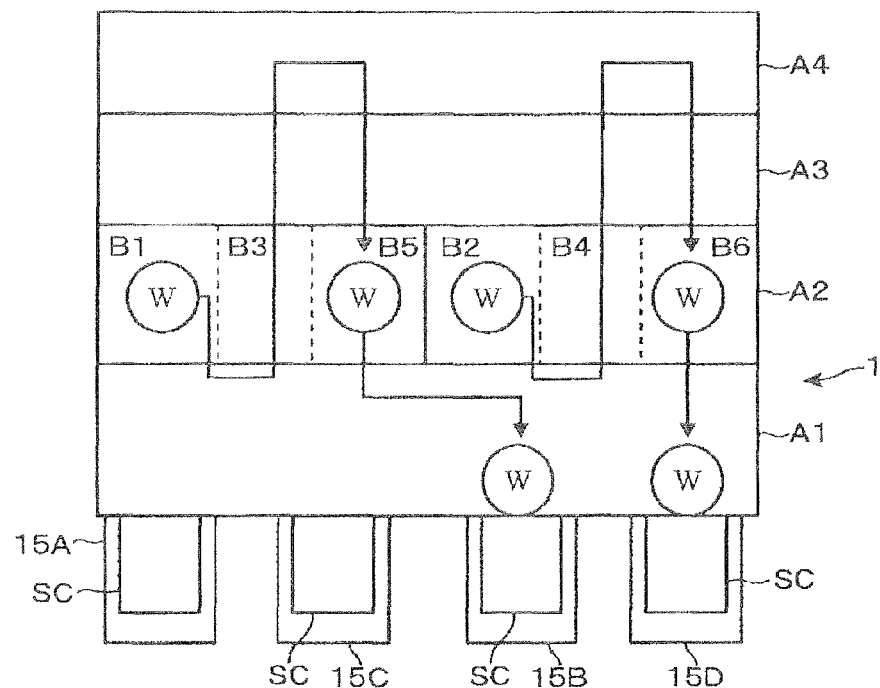
FIG. 15 is a schematic view of wafer transport paths in the coating and developing apparatus.

As shown in FIG. 14, wafers W in the sender carrier SC on the carrier placement unit 15A and wafers W in the sender carrier SC on the carrier placement unit 15C are respectively loaded into the delivery modules SCPL1 and SCPL2 and are taken into the first unit block B1 and the second unit block B2, by the first wafer transfer unit 41. The wafers W respectively transported to the unit blocks B1 and B2 may be transported in the same manner as described with reference to FIG. 12, for example, may be processed in the unit blocks B5 and B6 and may be transported to the delivery modules SCPL5 and SCPL6.

The wafers W having been transported to the delivery modules SCPL5 and SCPL6 are returned to the receiver carriers RC on the carrier placement units 15B and 15D, by the first holding arm 47 of the second wafer transfer unit 42. Namely, the wafer W having been discharged from the sender carrier SC on the carrier placement unit 15A is processed in the unit blocks B1, B3 and B5 and is transported to the receiver carrier RC on the carrier placement unit 15B, while the wafer W having been discharged from the sender carrier SC on the carrier placement unit 15C is processed in the unit blocks B2, B4 and B6 and is transported to the receiver carrier RC on the carrier placement unit 15D.

Figure 16:
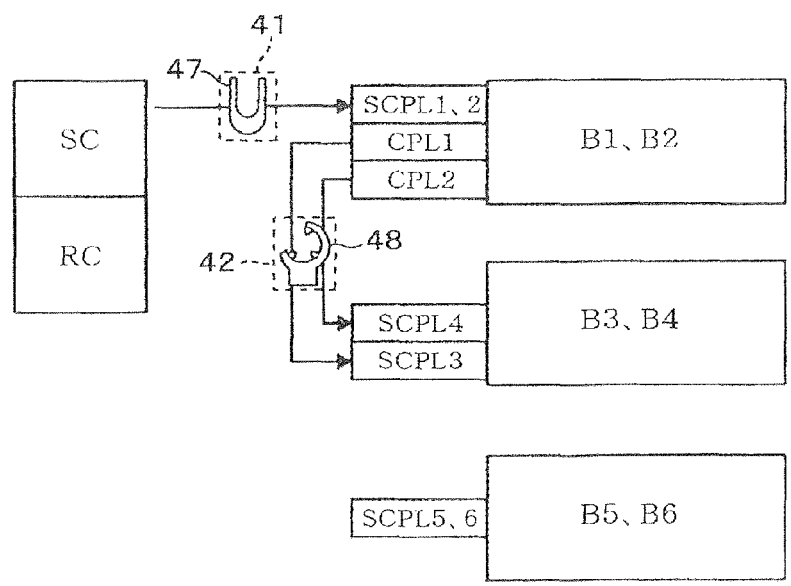
FIG. 16 is a schematic view of wafer transport paths in the coating and developing apparatus.

Operations of the wafer transfer units 41 and 42 when such a transport is performed are described in detail with reference to FIGS. 16 and 17. FIG. 16 schematically shows a transport path of a wafer W which is firstly discharged from the sender carriers SC in the above transport manner and transported to the delivery module SCPL5 or SCPL6, and the wafer transfer units 41 and 42 used in the course of the path. The first wafer transfer unit 41 discharges the wafer W from the sender carrier SC, by means of the first holding arm 47. On the other hand, transport of the wafer W from the delivery module CPL1 to the delivery module SCPL3 and transport of the wafer W from the delivery module CPL2 to the delivery module SCPL4 are performed independently by the second wafer transfer unit 42. When the first wafer W is transported to the delivery module SCPL5 or SCPL6, transport of the wafer W from the delivery module SCPL5 or SCPL6 to the receiver carrier RC is started by the first holding arm 47 of the second wafer transfer unit 42.

Figure 17:
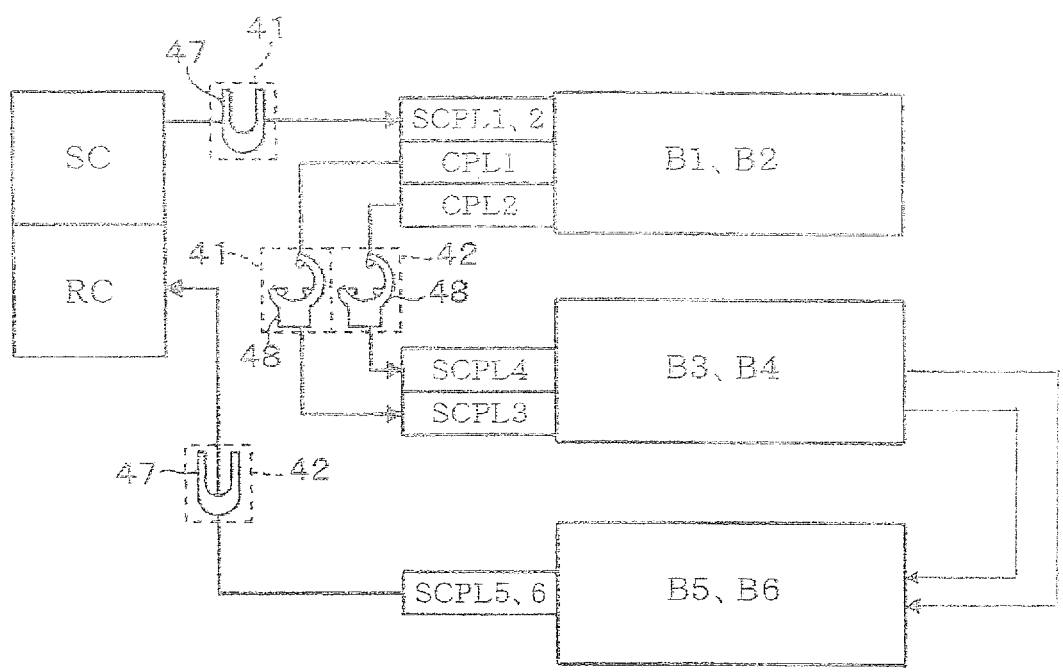
FIG. 17 is a schematic view of wafer transport paths in the coating and developing apparatus.

As an alternative example, as shown in FIG. 17, transport of the wafer W from the delivery module CPL1 to tie delivery module SCPL3 may be performed by the second holding arm 48 of the first wafer transfer unit 41. Namely, the first wafer transfer unit 41 is successively in charge of the transport of the wafer W to the sender carrier SC to the delivery modules SCPL1 and SCPL2, and also becomes in charge of the transport of the wafer W from the delivery module CPL1 to the delivery module SCPL3. The second wafer transfer unit 42 is successively in charge of the transport of the wafer W from the delivery module CPL2 to the delivery module SCPL4, and also becomes in charge of the transport of the wafer W from the delivery modules SCPL5 and SCPL6 to the receiver carriers RC.

According to the coating and developing apparatus 1, the first wafer transfer unit 41 capable of transferring wafers W to the carriers C placed on the carrier placement units 15A and 15C, and the second wafer transfer unit 42 capable of transferring wafers W to the carriers C placed on the wafer placement units 15B and 15D are arranged in the right and left direction so as to sandwich therebetween the tower unit including a number of delivery modules located at heights corresponding to the respective unit blocks. Thus, a floor area occupied by the coating and developing apparatus 1 can be restrained and wafers W can be simultaneously transferred to the carriers C by the respective wafer transfer units 41 and 42, whereby a throughput can be increased.

In addition, each of the wafer transfer units 41 and 42 include the first holding arm 47 which is exclusively used for transferring a wafer W between each carrier C and the delivery module, and the second holding arm 48 which is exclusively used for transferring a wafer W between delivery modules located at different heights. Thus, the size of the coating and developing apparatus 1 can be restrained, as compared with a case in which a plurality of transport mechanisms each including one of the holding arms are provided. In addition, as shown as an alternative embodiment below, the degree of freedom in layout of the structure and the positioning of the wafer transfer units 41 and 42 can be increased. Further, as to the delivery modules of the tower unit 31, it is not necessary for all the delivery modules to have the elevating pins. Thus, degree of freedom in structure of the delivery module can be increased. For example, it is not necessary that the delivery modules are arranged laterally. Thus, the occupied floor area can be restrained as well as enlargement of the apparatus can be avoided.

As described above, when one of the wafer transfer unit of the first wafer transfer unit 41 and the second wafer transfer unit 42 becomes unavailable, the other wafer transfer unit performs, in place of the one wafer transfer unit, transport of wafers W from the delivery modules CPL1 and CPL2 to the delivery modules SCPL3 and SCPL4, which might be performed by the one wafer transfer unit under the general condition. Thus, lowering of a throughput can be more reliably prevented.

In addition, as described above, when wafers W are transported between the sender carriers SC and the receiver carriers RC, a load on the second wafer transfer unit 42 is decreased during a period in which the transport of the wafers W from the delivery modules SCPL5 and SCPL6 to the receiver carriers RC is unnecessary. During this period, by exclusively using the first wafer transfer unit 41 for discharging wafers W from the sender carriers SC and by exclusively using the second wafer transfer unit 42 for transferring wafers W between the delivery modules, the discharge operation and the transport operation between the delivery modules can be performed promptly. After wafers W have been loaded into the delivery modules SCPL5 and SCPL6, the first wafer transfer unit 41 partly takes charge of the transport of wafers between the delivery modules, which as been performed by the second wafer transfer unit 42. Thus, uneven loads on the wafer transfer units 41 and 42 can be restrained. Thus, a throughput can be improved.

In the unit blocks having the same structure, it is possible to set a process such that wafers W are processed under different processing conditions. Namely, wafers W in the carriers C placed on the carrier placement units 15A ad 15C, and wafers W in the carriers C placed on the carrier placement units 15B and 15D may be processed under different chemical-liquid supply rates, different heating temperatures in the respective modules, such that respective films have different film thicknesses. Alternatively, it is possible to set a process such that wafers W are processed under the same condition in the unit blocks B having the same structure. In this case, wafers W in one carrier C can be transported alternately to the path in which the wafer W is passed through the unit blocks B1, B3 and B5, and to the path in which the wafer W is passed through the unit blocks B2, B4 and B6.

In the above transport manner, the delivery module from which wafers W are transferred to the unit blocks B1 and B2 and the delivery module to which wafers W having been unloaded from the unit blocks B1 and B2 are transferred may be the same. To be specific, a wafer W may be loaded into the unit block B1 from the delivery module SCPL1, and when the wafer W is unloaded from the unit block B1, the wafer W is transported to the delivery module SCPL1 and thereafter the wafer W may be transported to the delivery module SCPL3 by the first holding arm 47 or by the second holding arm 48 of the wafer transfer unit 41.

In the above transport manner, the positioning of the sender carriers SC and the receiver carriers RC is not limited to the above example, and the sender carriers may be positioned on one of the upper carrier placement units 15C and 15D and the lower carrier placement units 15A and 15B, and the receiver carriers may be positioned on the other.

When the aforementioned exposure apparatus A4 performs a liquid immersion exposure in which a wafer W is exposed with a space between an exposure lens and the wafer W being in a liquid phase, the above coating and developing apparatus 1 can be also applied. In this case, for example, it is advantageous that the two heating modules disposed on the respective shelf units U1 of the unit blocks B1 and B2 are constituted as two hydrophobing modules, so as to subject a wafer W to a hydrophobing process by supplying thereto a hydrophobing gas. In this case, for example, a delivery module SCPL for adjusting a temperature of a wafer W after the hydrophobing process is additionally disposed in the tower unit 31. A wafer W is processed by transporting the wafer W to the delivery module SCPL 1 or 2, the hydrophobing module, the delivery module SCPL and the antireflection-film formation module BCT.

In addition, the liquid-processing module TCT may be constituted as a module configured to coat a chemical liquid for forming a water-repellent protective film, so as to form the water-repellent protective film, instead of forming an antireflection film above a resist film. In this case, the protective film can prevent a liquid used in the liquid immersion exposure from permeating the resist film. In addition, in a range to which the interface arms 76 and 77 are accessible, there may be provided a rear-surface cleaning module which cleans, before exposure, a rear surface of a wafer W, which has been processed in the unit blocks B3 or B4, by means of a brush, and an post-exposure cleaning module which cleans a front surface of the wafer W before it is loaded into the unit block B5 or B6 after exposure.

(Second Embodiment)

Figure 18:
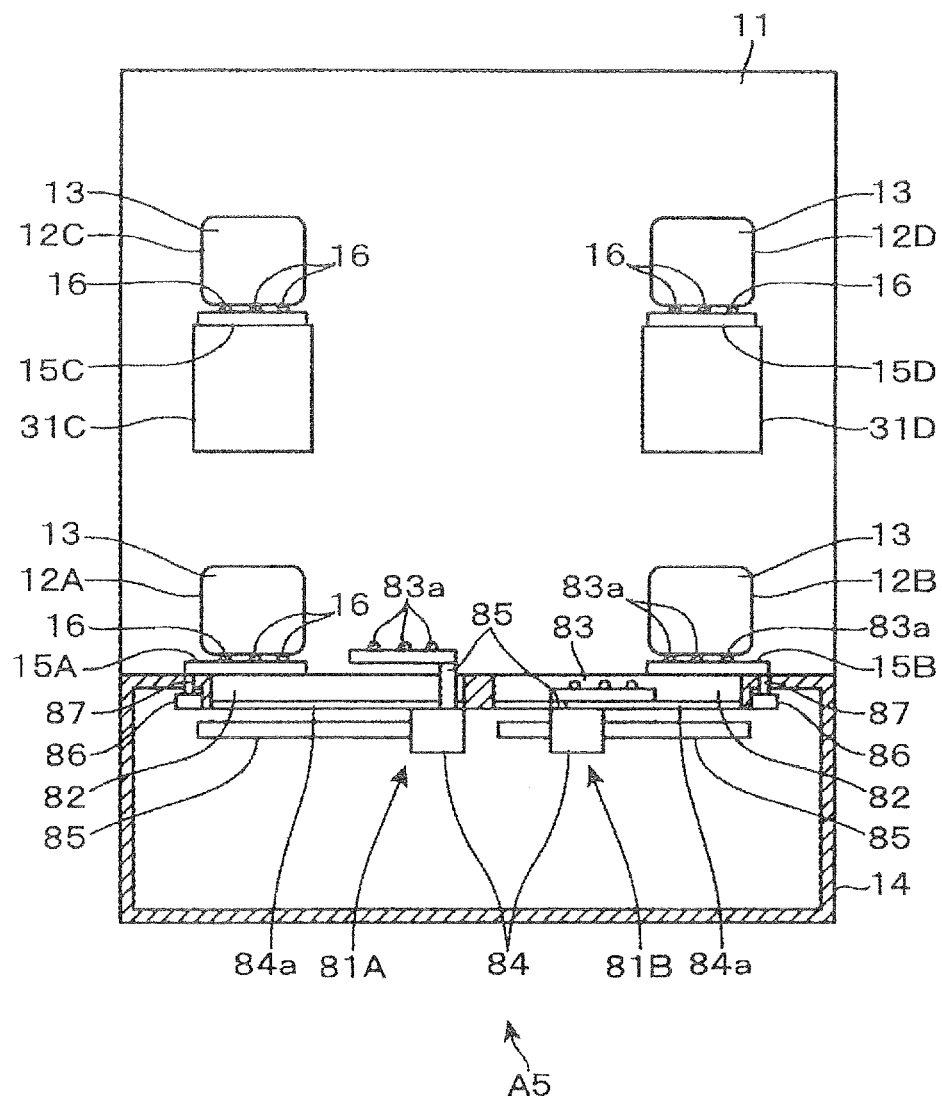
FIG. 18 is a front view of a carrier block in a second embodiment.

Herebelow, other embodiments are described, focusing on differences from the first embodiment. FIG. 18 is a front view of the carrier block A5 in the second embodiment. The carrier block A5 includes carrier moving mechanisms 81A and 81B, instead of the carrier moving mechanisms 26A and 26B. The support platform 14 has groove portions 82 and 82 extending from positions corresponding to the aforementioned temporary placement units 17A and 17B toward the carrier placement units 15A and 15B. There are provided carrier bottom-surface support units 83 constituting the carrier moving mechanisms 81A and 81B in the groove portions 82 and 82, respectively.

Figure 19:
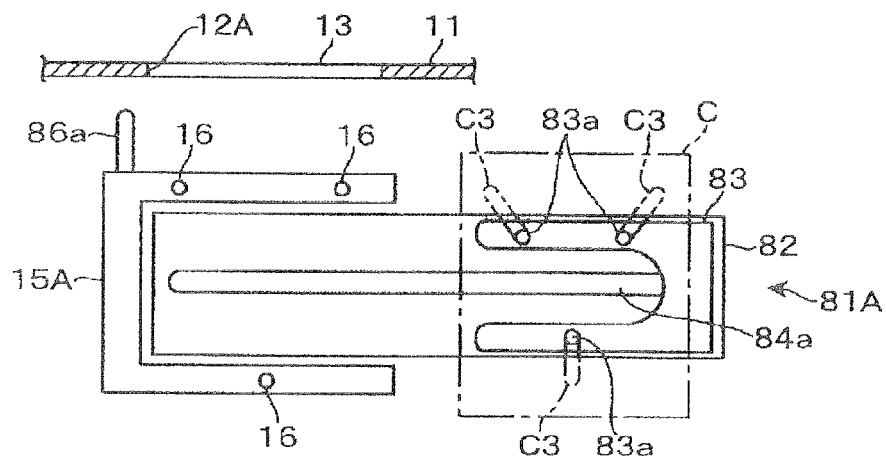
FIG. 19 is a plan view of a carrier moving mechanism disposed on the carrier block.

Since the carrier moving mechanism 81A and 81B have the same structure, the carrier moving mechanism 81A is described as a representative, with reference also to FIG. 19 showing a plan view thereof. The carrier bottom-surface support unit 83 is configured to be movable in the right and left direction along the groove portion 82, and configured to be vertically movable between an inside of the groove portion 82 and an area above the groove portion 82. The reference number 84 depicts a driving mechanism which elevates and lowers the carrier bottom-surface support unit 83 and moves the same in the right and left direction. The reference number 85 depicts a guide rail for guiding the driving mechanism 84 in the right and left direction. The reference number 84a depicts a slit through which a connection part 85 connecting the driving mechanism 84 and the carrier bottom-surface support unit 83 passes. The carrier bottom-surface support unit 83 is provided with a pin 83a extending upward. As shown in FIG. 19, the respective pins 83a are fitted in three grooves C3 formed in a bottom surface of the carrier C so as to restrict a position thereof.

Figure 20:
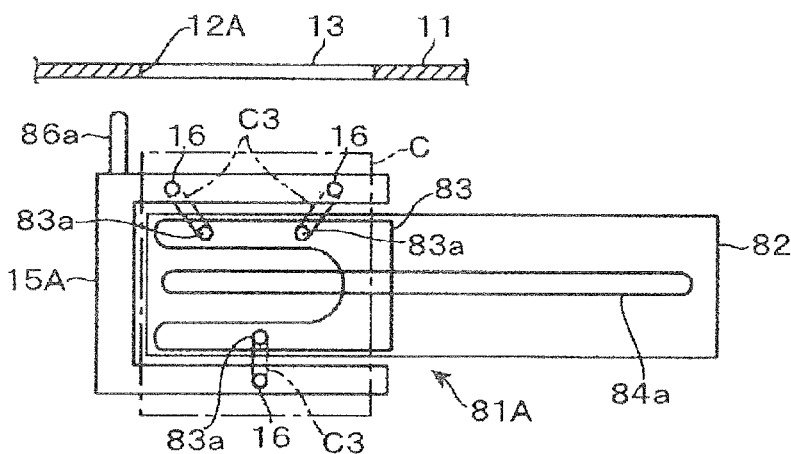
FIG. 20 is a plan view of a carrier moving mechanism disposed on the carrier block.

In this example, the carrier placement units 15A and 15B each has a substantially U-shape in plan view. As shown in FIG. 20, when the carrier bottom-surface support unit 83 comes into an range surround by the U-shape, the carrier bottom-surface support unit 83 can be located in front of the transport opening 12A. The reference number 86 in FIG. 18 depicts a driving mechanism for moving the carrier placement unit 15A in the back and forth direction. The reference number 86a in FIG. 19 depicts a slit through which a connection part 87 connecting the driving mechanism 88 and the carrier placement unit 15A passes.

Transfer of the carrier C by the carrier moving mechanism 81A is described. As shown in FIGS. 18 and 19, the carrier C is transferred from the ceiling transport mechanism 21 to the carrier bottom-surface support unit 83 which has been moved to the waiting position that does not overlap with the upper support platform 31C, and the pins 83a are fitted into the grooves C3 of the carrier C. At this time, the carrier C is received by the carrier bottom-surface support unit 83 above the groove portion 82, such that a position of the bottom surface of the carrier C is located higher than the pins 16 of the carrier placement unit 15A. Then, the carrier bottom-surface support unit 83 is moved to the front of the transport opening 12A and then is moved downward. Thus, the pins 16 of the carrier placement unit 15A come into the grooves C3 so as to be fitted therein, so that the carrier C is placed on the carrier placement unit 15A with its position being fixed. The carrier bottom-surface support unit 83 is further moved downward in the groove portion 82, so that the pins 83a are disengaged from the grooves C3. Thus, the fitting between the carrier bottom-surface support unit 83 and the groove portion 82 is released. Then, the carrier bottom-surface support unit 83 is moved horizontally and then moved upward so as to return to the waiting position.

Figure 21:
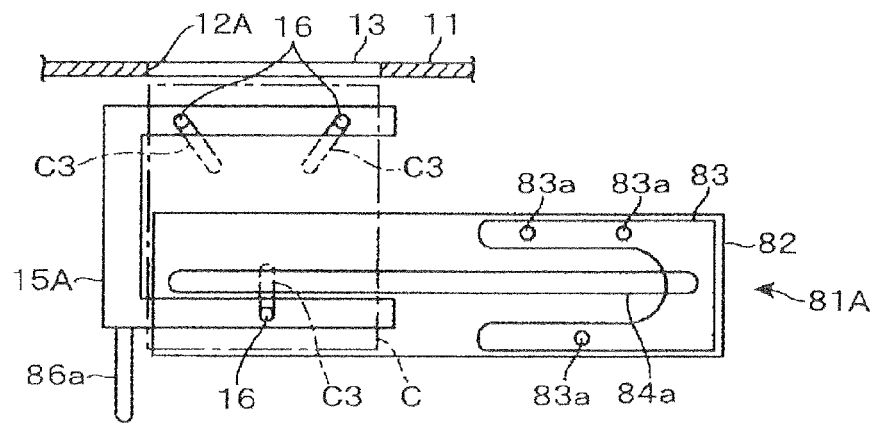
FIG. 21 is a plan view of a carrier moving mechanism disposed on tie carrier block.

Thereafter, as shown in FIG. 21, the carrier placement unit 15A having received the carrier C is moved forward, and then wafers W are discharged therefrom as described above. When the carrier C is sent to the ceiling transfer mechanism 21, the carrier placement unit 15A and the carrier bottom-surface support unit 83 are operated reversely, such that the carrier C is sent to the carrier bottom-surface support unit 83 and the ceiling transport mechanism 21 receives the carrier C from the carrier bottom-surface support unit 83.

(Third Embodiment)

Figure 22:
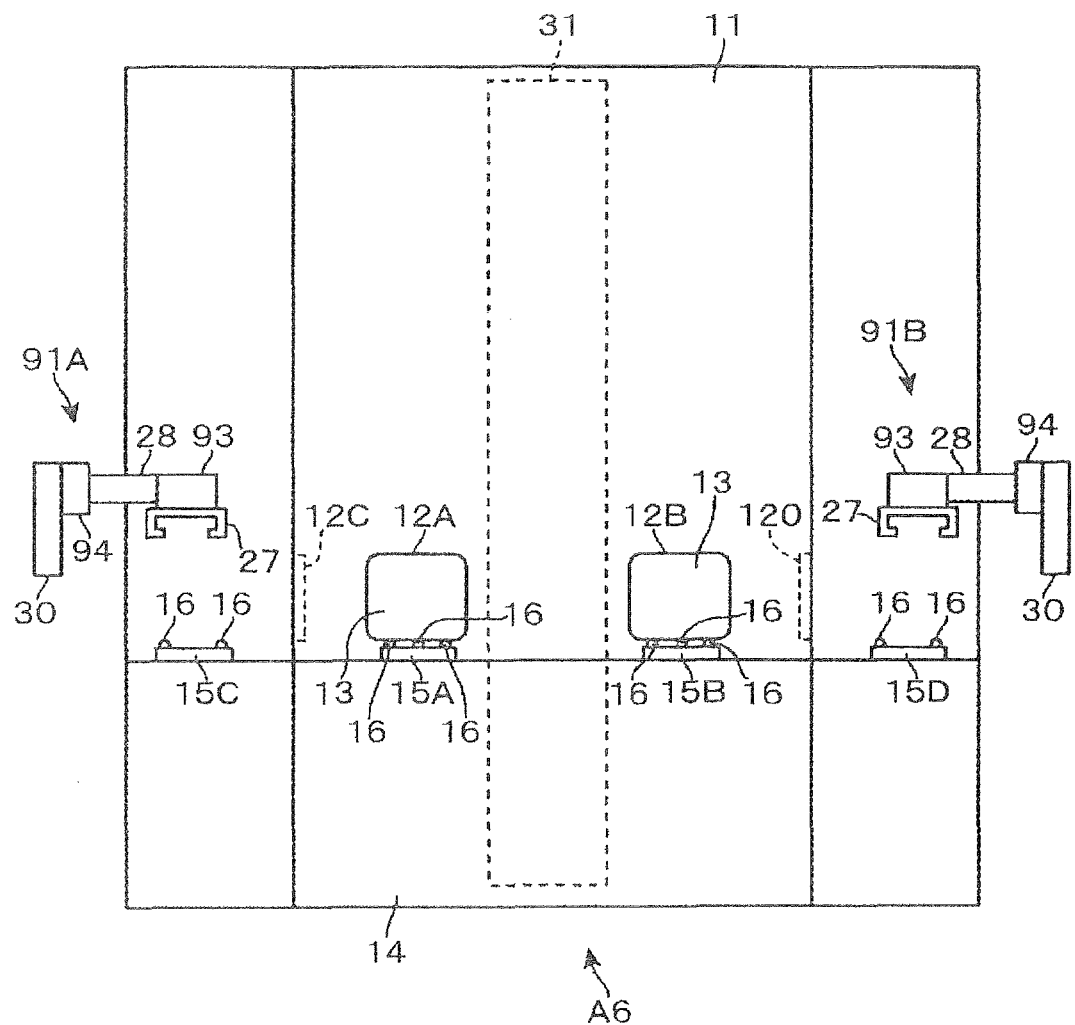
FIG. 22 is a front view of a carrier block in a third embodiment.
Figure 23:
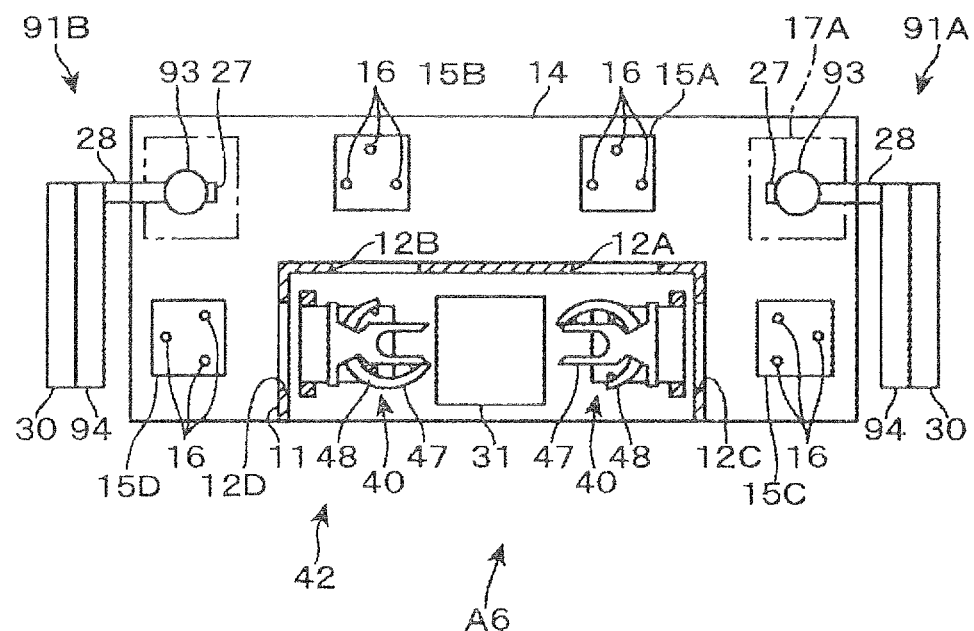
FIG. 23 is a cross-sectional view of the carrier block.

FIGS. 22 and 23 are a front view and a longitudinal sectional plan view of a carrier block A6 in a third embodiment. The carrier block A6 differs from the carrier block A1 in that the carrier block A6 does not have the upper support platforms 31C and 31D, and that the support platform 14 is formed to extend from a front surface side to side surface sides of the carrier block A6. The transport openings 12C and 12D for wafer W are formed in the side surfaces of the carrier block A6. The transport openings 12A to 12D are disposed at the same height, for example. The carrier placement units 15C and 15D are provided correspondingly to the transport openings 12C and 12D. When the carrier block A6 is viewed from the front side, the carrier placement units 15C and 15D are configured to be movable between the unloading position and the loading position in the right and left direction. In this example, corner parts of the support platform 14 are formed as the temporary placement units 17A and 17B.

The carriers C are sent from the ceiling transport mechanism 21 to the temporary placement units 17A and 17B and the carrier placement units 15A and 15B, such that each lid body C1 faces the back side (rear side) of the apparatus. Orientations of the carriers C placed on the temporary placement units 17A and 17B are changed by carrier moving mechanisms 91A and 91B, such that the lid bodies C1 face the transport openings 12C and 12D, and then the carriers C are placed on tie carrier placement units 15C and 15D. The carrier moving mechanisms 91A and 91B constituted substantially similarly to the carrier moving mechanisms 26A and 26B. However, differently from the carrier moving mechanisms 26A and 26B, a gripping unit 27 is disposed on a distal end side of a rod 28 through a rotating unit 93, and a proximal end side of the rod 28 is connected to an elevating mechanism through a back-and-forth moving mechanism 94. The gripping unit 27 is configured to be rotatable about a vertical axis by the rotating unit 93, while the gripping unit 27 gripping the portion C2 to be gripped of the carrier. The griping unit 27 can be moved in the back and forth direction by the back-and-forth moving mechanism 94.

In addition, in the carrier block A6, the guide rail 43 is not provided, so that the support frames 44 of the first wafer transfer unit 41 and the second wafer transfer unit 42 are not moved in the right and left direction. By a vertical movement, a rotational movement, and advancing and retreating movements of the first holding arm 47, the transfer unit body 40 of the first wafer transfer unit 41 transfers wafers W between the carriers C on the carrier placement units 15A and 15C and the tower unit 31. Similarly, a vertical movement, a rotational movement, and advancing and retreating movements of the first holding arm 47, the transfer unit body 40 of the second wafer transfer unit 42 transfers wafers W between the carriers C on the carrier placement units 15B and 15D and the tower unit 31. When the apparatus is constituted by such a carrier block A6, the same effect as that of the first embodiment can be obtained. According to the layout of the carrier block A6, since the wafer transfer units 41 and 42 are not needed to move in the right and left direction, wafers W can be more promptly transported between the carrier C and the tower unit 31. Thus, a throughput can be more reliably improved. In addition, since the wafer transfer units 41 and 42 are not moved in the right and left direction, a floor area occupied by the apparatus can he further reduced.

As long as each of the first wafer transfer unit 41 and the second wafer transfer unit 42 can access the carrier C, the layout of the respective carrier placement units 15 is not limited to the aforementioned layout. For example, the carrier placement units 15 may be laterally arranged in a line, or may be arranged at different heights. Further, the number of the carrier placement units 15 is not limited to four but may be two. The number of vertical levels of the carrier placement units 15 is not limited to two but may be three or more.

(Fourth Embodiment)

Figure 24:
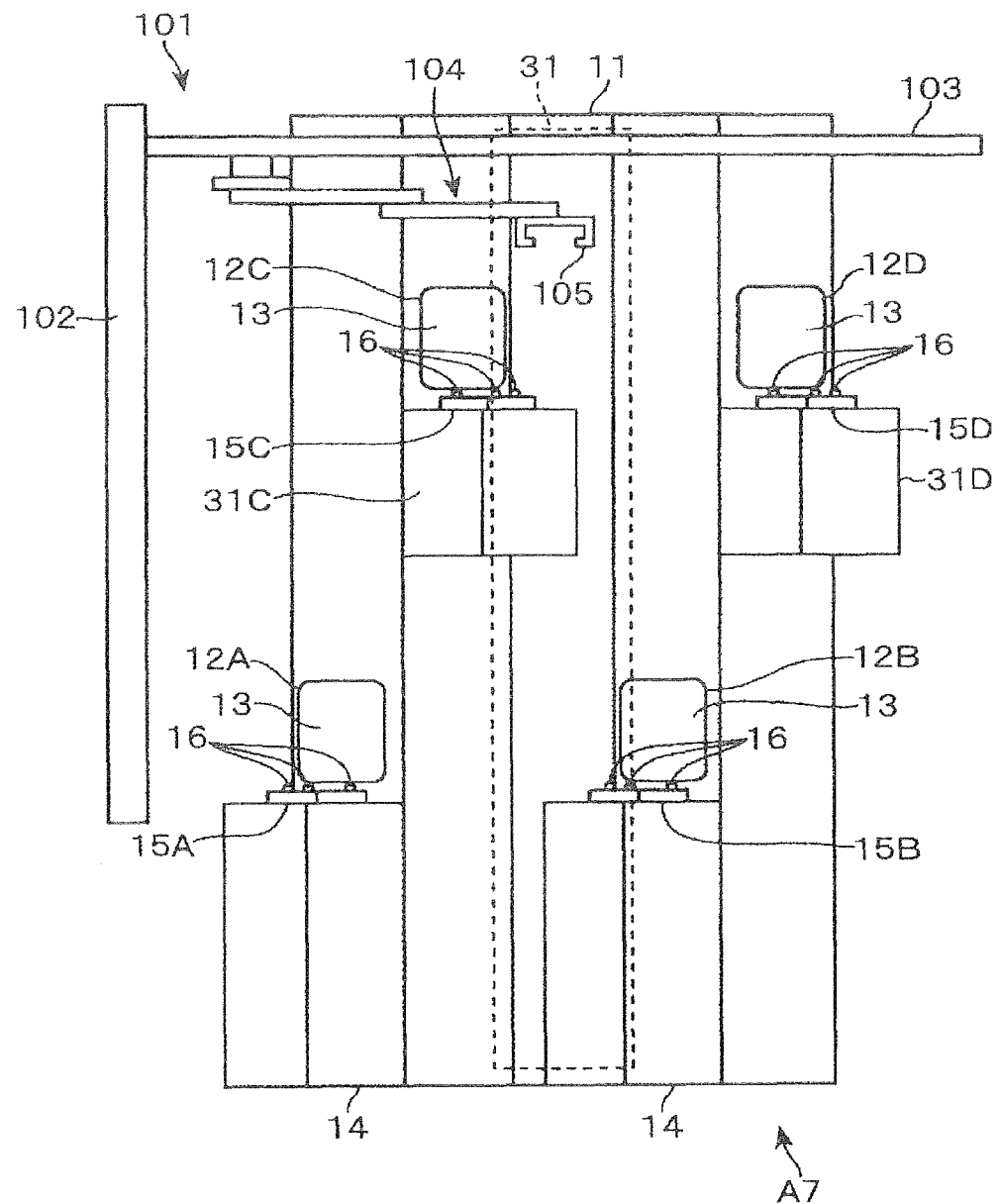
FIG. 24 is a front view of a carrier block in a fourth embodiment.
Figure 25:
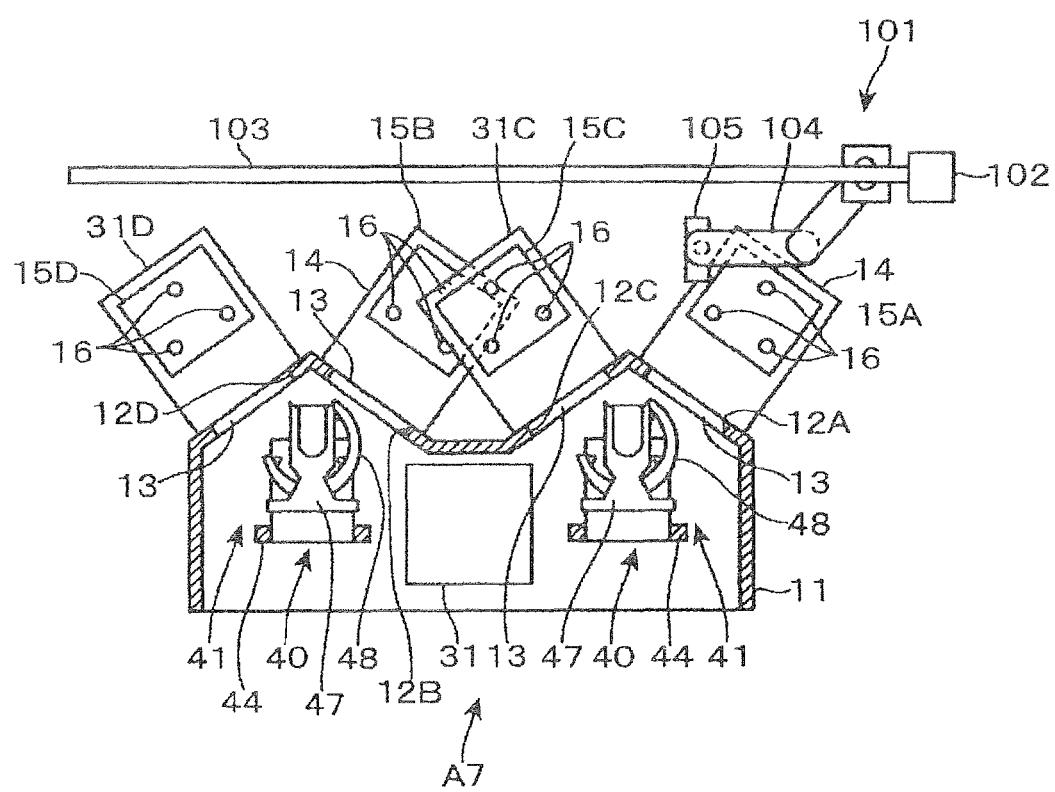
FIG. 25 is a cross-sectional view of the carrier block.

FIGS. 24 and 25 are a front view and a longitudinal sectional plan view of a carrier block A7 in a fourth embodiment. In the carrier block A7, similarly to the carrier block A6, the guide rail 43 is not provided so that the support frames 44 of the wafer transfer units 41 and 42 are not moved in the right and left direction. On the front side of a housing 11 of the carrier block A7, portions facing the first wafer transfer unit 41 and the second wafer transfer unit 42 project forward. Thus, as shown in FIG. 25, the front side of the housing 11 has a shape in which two mountains are arranged. The transport openings 12A to 12D are respectively formed in slopes of the mountains of the housing 11 having a shape of two mountains in plan view. As shown in FIG. 24, height positions of the transport openings 12 formed in the slopes of one mountain differ from each other.

Similarly to the carrier block A1, the transport openings 12A and 12B are formed on a lower side and the transport openings 12C and 12D are formed on an upper side. Each of the carrier placement units 15 is configured to be moved in an opening direction of each transport opening 12, so as to receive the carrier C from each carrier placement unit 15 and to discharge wafers W from the carrier C. Similarly to the first embodiment, the first wafer transfer unit 41 is configured to transport a wafer W through the transport openings 12A and 12C, and the second wafer transfer unit 42 is configured to transport a wafer W through the transport openings 12B And 12D.

The carrier block A7 is provided with a carrier replacement mechanism 101. The carrier replacement mechanism 101 includes a vertical shaft 102, a horizontal shaft 103 configured to be vertically movable along the vertical shaft 102 and extended in the right and left direction, and an articulated arm 104 whose proximal end side is horizontally movable along the horizontal shaft 103. A gripping unit 105 is disposed on a distal end side of the articulated arm 104, so that the portion C2 to be gripped of the carrier C can be gripped. Due to this structure, the carrier replacement mechanism 101 can transfer the carrier C among the carrier placement units 15A to 15D.

The carrier C is directly transferred between the ceiling transport mechanism 21 and the carrier placement units 15A, 15C and 15D. Since the carrier placement unit 15C is located above the carrier placement unit 15B, when the carrier C is sent to the carrier placement unit 15B, the ceiling transport mechanism 21 temporarily places the carrier C on one of the carrier placement units 15A, 15B and 15D, and then the carrier replacement mechanism 101 transports the carrier C to the carrier placement unit 15B. When the carrier C is sent from the carrier placement units 15B to the ceiling transport mechanism 21, an operation reverse to above is performed. When the carrier block has such a structure, an effect similar to that of the third embodiment can be obtained.

The carrier replacement mechanism 101 may be disposed on the other respective embodiments. For example, the carrier replacement mechanism 101 may be disposed on the carrier block A1, for example. In the carrier block A1 having such a structure, a plurality of carrier placement units may be disposed in addition to the above carrier placement units 15A to 15D. In this case, when the first wafer transfer unit 41 is not used, the carriers C on these carrier placement units and the carriers on the carrier placement units 15A to 15D may be replaced from each other, by the griping unit 105 of the carrier replacement mechanism 101. The other carrier placement units to be disposed in the carrier block than the carrier placement units 15A to 15D are disposed within a range to which the carrier replacement mechanism 101 is accessible, and formed as shelves at plural levels. Namely, the carrier C can be placed on each stage of the shelf.

An example of transport of the carrier C in this carrier block A1 in this case is concretely described. Firstly, wafers W are discharged from the carriers C placed on the carrier placement units 15A and 15C. Upon completion of the discharge of the wafers W from the carriers C placed on the carrier placement units 15A and 15C, when other carriers C are placed on the carrier placement units 15B and 15D, the carriers C on the carrier placement units 15A and 15C, from which the wafers W have been discharged, are moved to the shelves by the carrier replacement mechanism 101, so as to cause the carriers C to wait there. When the carrier placement units 15B and 15D become vacant, the carriers C on the shelves are transferred to the carrier placement units 15B and 15D. Then, wafers W stored in the buffer module BU are sent to the carriers C on the carrier placement units 15B and 15D by the second wafer transfer unit 42, so as to collect the wafers W. According to this method, the wafers W can be returned to the carrier C from which these wafers W have been discharged. Succeeding carriers C are transferred to the carrier placement units 15A and 15C from which the carriers C placed thereon have been moved to the shelves, and wafers W are discharged therefrom. Similarly, when tie second wafer transfer unit 42 is not used, the carriers C on the carrier placement units 15B and 15D, from which wafers W have been discharged, are moved to the shelves by the carrier replacement mechanism 101, so as to cause the carriers C to wait there. Thereafter, the carriers are transferred to the carrier placement units 15A and 15C. Then, wafers W are collected into the carriers C having been transferred to the carrier placement units 15A and 15C, by the first wafer transfer unit 41. Thus, an operation by a user for collecting wafers W from the buffer module BU can be omitted.

In addition to the transport of the carrier C between the right and left carrier placement units 15 with the use of the carrier replacement unit 101, the carrier C may be transferred between the upper and lower carrier placement units 15. For example, in the apparatus of the first embodiment including the carrier replacement mechanism 101 and the shelves, wafers W are discharged from the carriers C placed on the lower carrier placement units 15A and 15B. The respective carriers C are transferred by the carrier replacement mechanism 101 to the upper carrier placement units 15C and 15D through the aforementioned shelves. Then, the processed wafers W are returned to, e.g., the carriers C from which these wafers W have been discharged, by the wafer transfer units 41 and 42. Succeeding carriers C are transported to the carrier placement units 15A and 15B from which the carriers C placed thereon have been moved to the shelves, and loading of wafers W into the apparatus is continued. Reversely to above, wafers W may be discharged from the carriers C on the upper carrier placement units 15C and 15D, the carriers C from which the wafers W have been discharged may be transferred to the lower carrier placement units 15A and 15B, and the processed wafers W may be returned to the carriers C.

Figure 26:
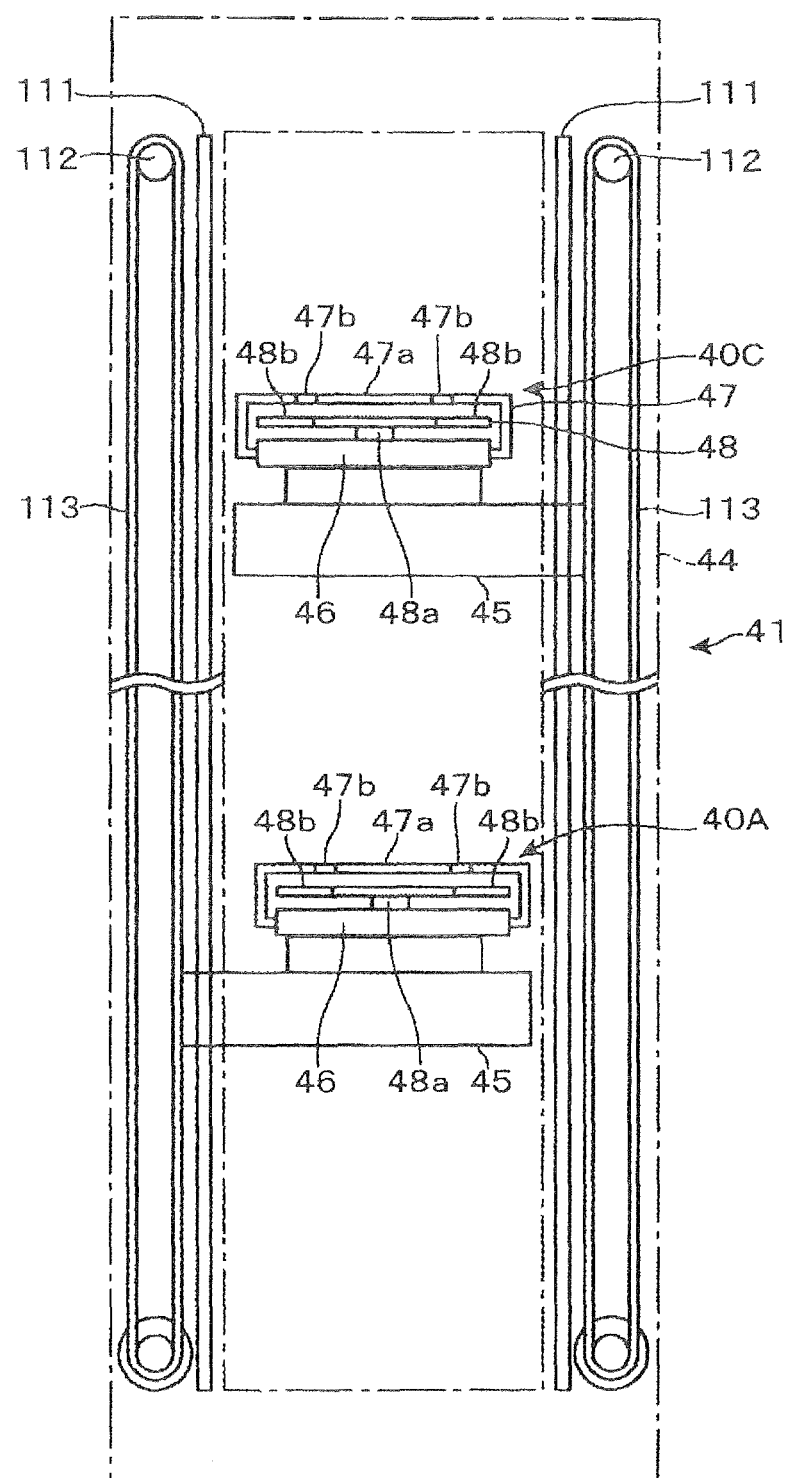
FIG. 26 is a front view showing another structure of the wafer transfer mechanism.

When the carrier placement units 15 are vertically arranged as in the carrier blocks A1, A5 and A7, as shown in FIG. 26, the transfer unit bodies 40 may be vertically arranged on one support frame 44. The upper transfer unit body accesses the carriers C placed on the upper carrier placement units 15, and the lower transfer unit body accesses carriers C on the lower carrier placement units 15. Namely, in terms of function, the wafer transfer units 41 and 42 as substrate transfer mechanisms are respectively divided into an upper transfer unit body and a lower transfer unit body. In the first wafer transfer unit 41, the upper transfer unit body is shown by the reference number 40C and the lower transfer unit body is shown by the reference number 40A. In the second wafer transfer unit 42, the upper transfer unit body is shown by the reference number 40D and the lower transfer unit body is shown by the reference number 40B.

A structure of the first wafer transfer unit 41 including the transfer unit bodies 40A and 40C is briefly described. In FIG. 26, the reference numbers 111 and 111 depict guide rails which are respectively disposed on two vertically extending columnar parts of the support frame 44 so as to vertically guide the transfer unit bodies 40A and 40C, respectively. The reference numbers 112 and 112 depict pulleys. The reference numbers 113 and 113 depict belts on which elevation base platforms 45 of the transfer unit bodies 40A and 40C are locked. The reference numbers 114 and 114 depict motors which are disposed correspondingly to the pulleys 112 and 112. The belts 113 and 113 are driven by the motors 114 and 114 independently of each other, so that the elevation base platforms 45 are vertically moved independently of each other along the guide rails 111 and 111. Since the second wafer transfer unit 42 may have the same structure as that of the first wafer transfer unit 41, description thereof is omitted.

(Fifth Embodiment)

Figure 27:
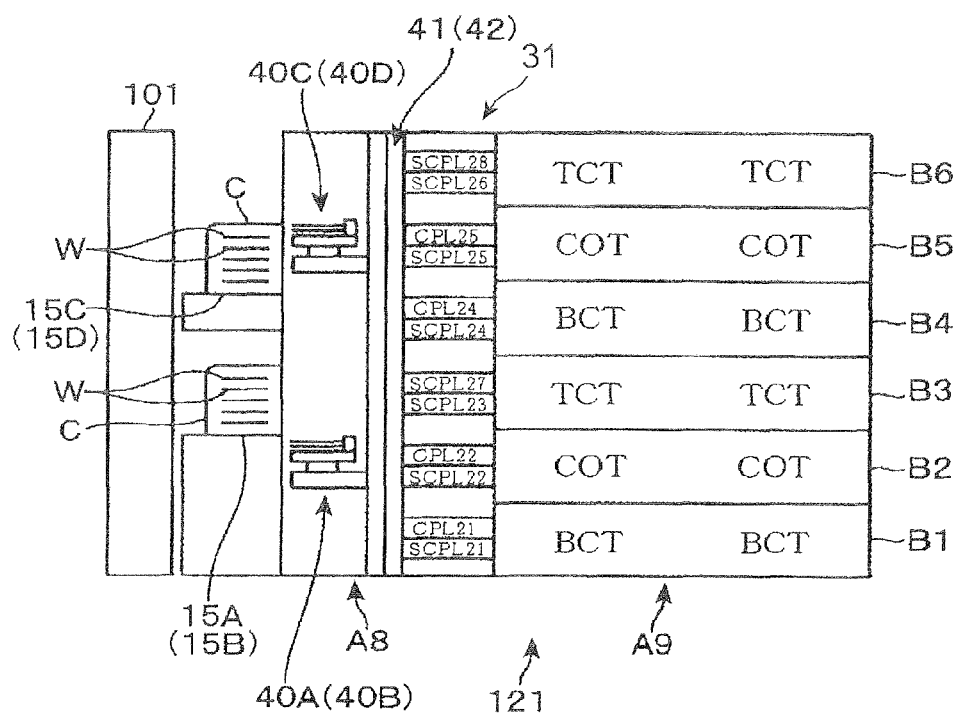
FIG. 27 is a schematic side view of a coating apparatus in a fifth embodiment.

A structural example of the apparatus to which the carrier block S7 including the transfer unit bodies 40A to 40D is applied, and a transport example of wafers W in this apparatus are described. FIG. 27 shows a coating apparatus 121 in which the carrier block A8 and a processing block A9 are connected to each other. The carrier block A8 is constituted similarly to the carrier block A7, excluding that the transfer unit bodies 40A and 40D are provided, and that the delivery modules of the tower unit 31 are positioned correspondingly to the processing block 9. FIG. 27 shows the tower unit 31 and the wafer transfer units 41 and 42 which are displaced in the back and forth direction, as a matter of convenience.

The processing block A9 is composed of the above unit blocks B1 to B6. However, the liquid processing modules disposed in the liquid processing unit 71 are different from the first embodiment as follows. Namely, the antireflection-film formation modules BCT are disposed in the processing blocks B1 and B4, the resist coating modules COT are disposed in the unit blocks B2 and B5, and the upper antireflection-film formation modules TCT are disposed in the unit blocks B3 and B6. Delivery modules SCPL21 to 26 for sending wafers to the respective unit blocks B1 to B6 are provided in the tower unit 31 of the carrier block. Delivery modules CPL21, CPL22, CPL24 and CPL25 for receiving wafers from the unit blocks B1, B2, B4 and B5 are respectively provided, and delivery modules SCPL 27 and SCPL28 for receiving wafers from the unit blocks B3 and B6 are provided.

Figure 28:
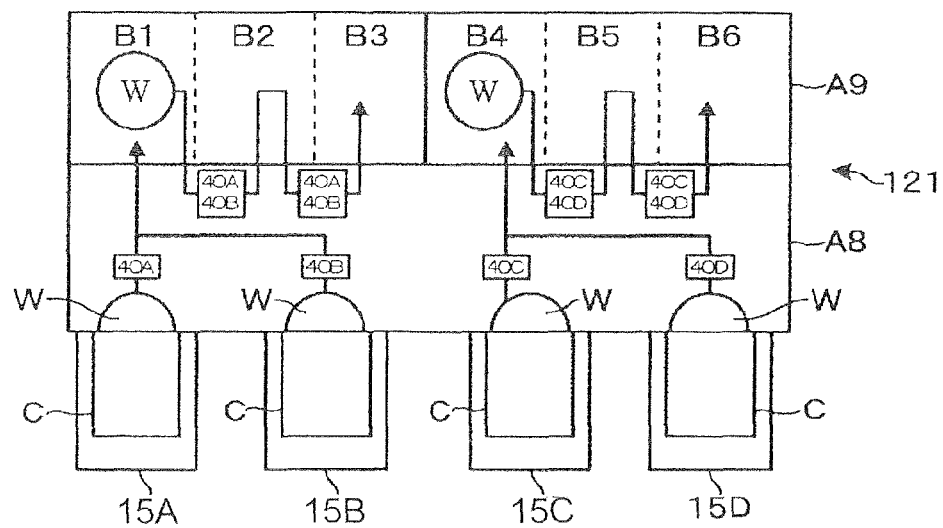
FIG. 28 is a schematic view of wafer transport paths in the coating apparatus.
Figure 29:
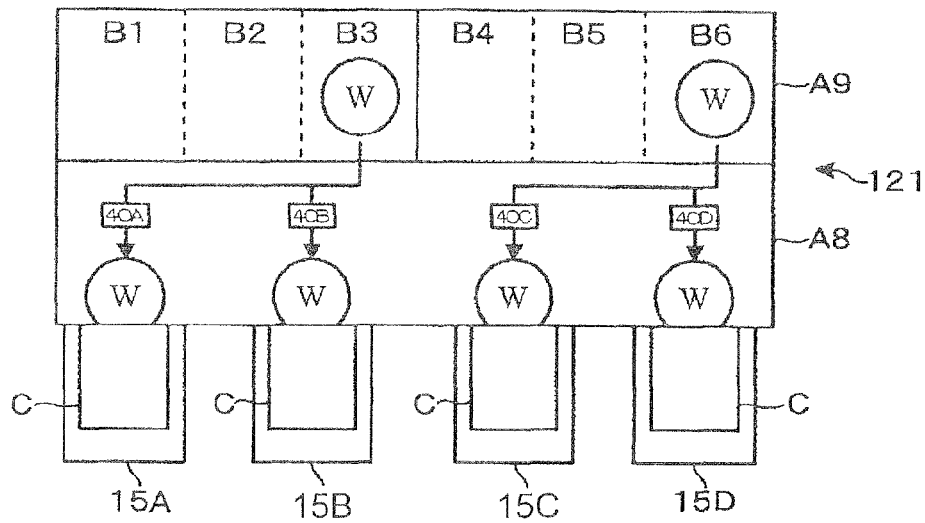
FIG. 29 is a schematic view of wafer transport paths in the coating apparatus.

FIGS. 28 and 29 show transport paths of wafers W in the coating apparatus 121. In this example, a wafer W is returned to the carrier C from which the wafer W has been unloaded. Wafers W are transported between the carriers C placed on the carrier placement units 15A and 15B and the unit blocks B1 to B3, and wafers W are transported between the carriers C placed on the carrier placement units 15C and 15D and the unit blocks B4 to B6. Similarly to the first embodiment, wafers are simultaneously transported along these two paths.

By means of the first holding arm 47, the transfer unit bodies 40A and 409 of the carrier block A8 transfer a wafer W from the carriers C on the carrier placement units 15A and 15B to the delivery modules SCPL21. By means of the second holding arm 48, the transfer unit bodies 40A and 40B transport the wafer W, on which an antireflection film has been formed in the unit block B1 and which has been transported to the delivery module CPL21, to the delivery module SCPL22, and thereafter transport the wafer W on which a resist film has been formed in the unit block B2 and which has been transported to the delivery module CPL22, to the delivery module SCPL23 (FIG. 28). Then, by means of the first holding arm 47, the transfer unit bodies 40A and 40B return the wafer W on which an upper antireflection film has been formed in the unit block B3, to the carriers C placed on the carrier placement units 15A and 15B (FIG. 29).

The upper transfer unit bodies 40C and 40D of the carrier block A8 are operated similarly to the transfer unit bodies 40A and 40B, excluding that the upper transfer unit bodies 40C and 40D access the carriers C on the carrier placement units 15C and 15D, and that the upper transfer unit bodies 40C and 40D access the delivery modules CPL and SCPL at heights corresponding to the unit blocks B4 to B6. As shown in FIG. 28, a wafer W having been discharged from the carrier C is sequentially transported to the unit blocks B4, B5 and B6 in which respective films are formed on the wafer W, and thereafter the wafer W is returned to the carrier C as shown in FIG. 29.

Figure 30:
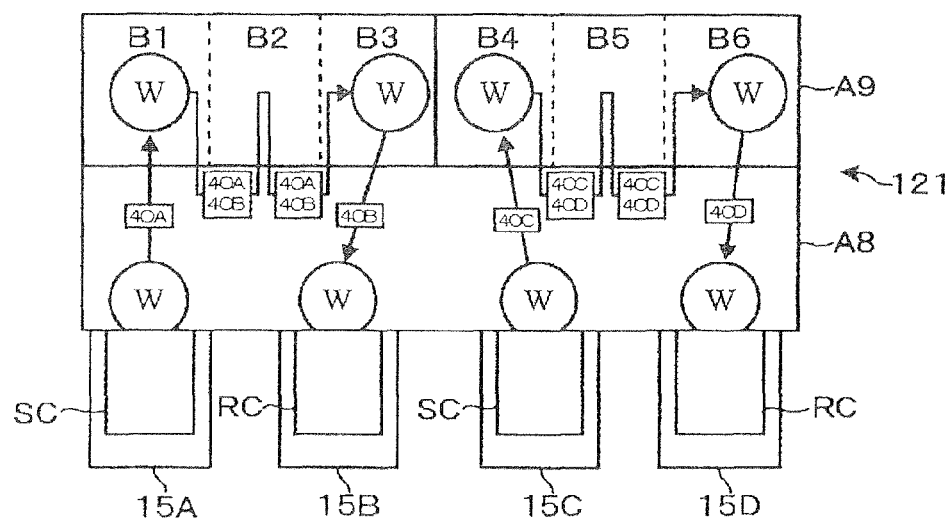
FIG. 30 is a schematic view of wafer transport paths in the coating apparatus.

Another transport example of the coating apparatus 12 is described with reference to FIG. 30. In this example, the aforementioned sender carriers are placed on the carrier placement units 15A and 15C, and the receiver carriers RC are placed on the carrier placement units 15B and 15D. A wafer W discharged from the sender carrier SC on the carrier placement unit 15A is transported to the unit blocks B1 to B3, as described above. After respective films have been formed, the wafer W is loaded into the receiver carrier RC on the carrier placement unit 15B. A wafer W discharged from the sender carrier SC on the carrier placement unit 15C is transported to the unit blocks B4 to B6, as described above. After respective films have been formed, the wafer W is loaded into the receiver carrier RC on the carrier placement unit 15D. The receiver carriers RC may be placed on the carrier placement units 15A and 15C and the sender carriers SC may be placed on the carrier placement units 15B and 15D. Also when the carrier bock and the processing block are constituted as a coating apparatus, effects of improvement in throughput and reduction in occupied floor area can be obtained, similarly to when the carrier block and the processing block are constituted as a coating and developing apparatus.

(Sixth Embodiment)

Figure 31:
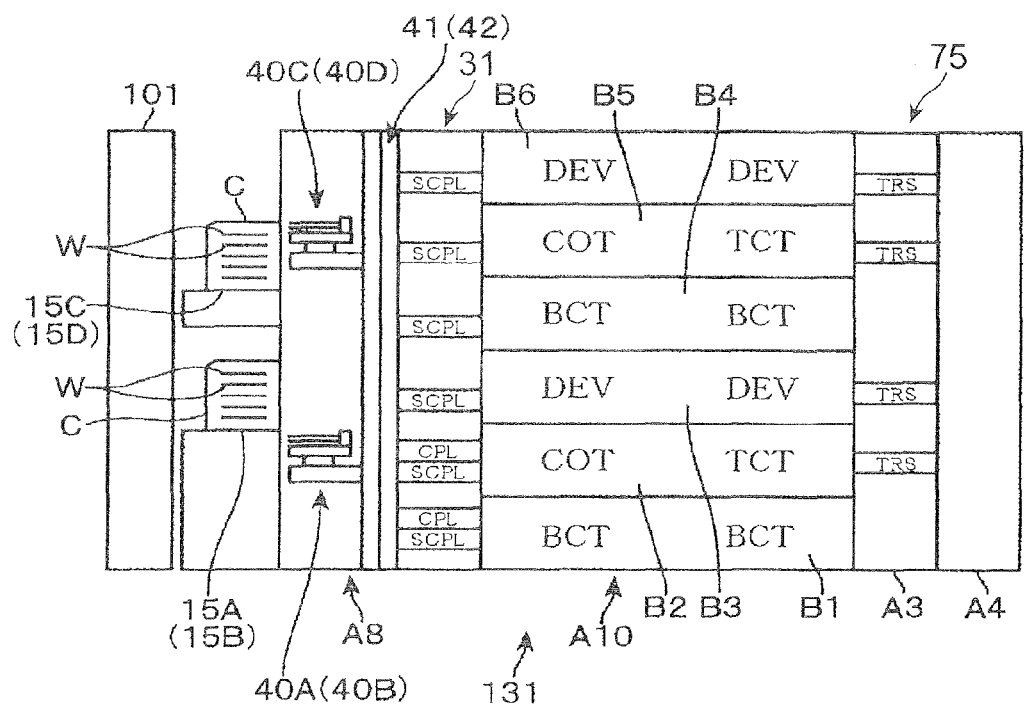
FIG. 31 is a schematic side view of a coating and developing apparatus in a sixth embodiment.

The apparatus may be constituted such that a coating and developing process can be performed by simultaneously transporting wafers W to the unit blocks B1 to B3 and to the unit blocks B4 to B6. FIG. 31 shows a coating and developing apparatus 131 having such a structure. Differently from the coating apparatus 121, the unit blocks B2 and B4 constituting a processing block A10 are provided with a resist coating module COT and an upper antireflection-film formation module TCT, respectively, and the unit blocks B3 and B6 are provided with developing modules DEV. The carrier block A8 in this embodiment is similar to that of the fifth embodiment, excluding that the delivery modules of the tower unit 31 are positioned correspondingly to the processing blocks. In the interface tower unit 75, delivery modules TRS are arranged such that a wafer having been processed in the unit blocks B2 and B5 is transported to the exposure apparatus, and that the exposed wafer W is transported to the unit blocks B3 and B6.

Figure 32:
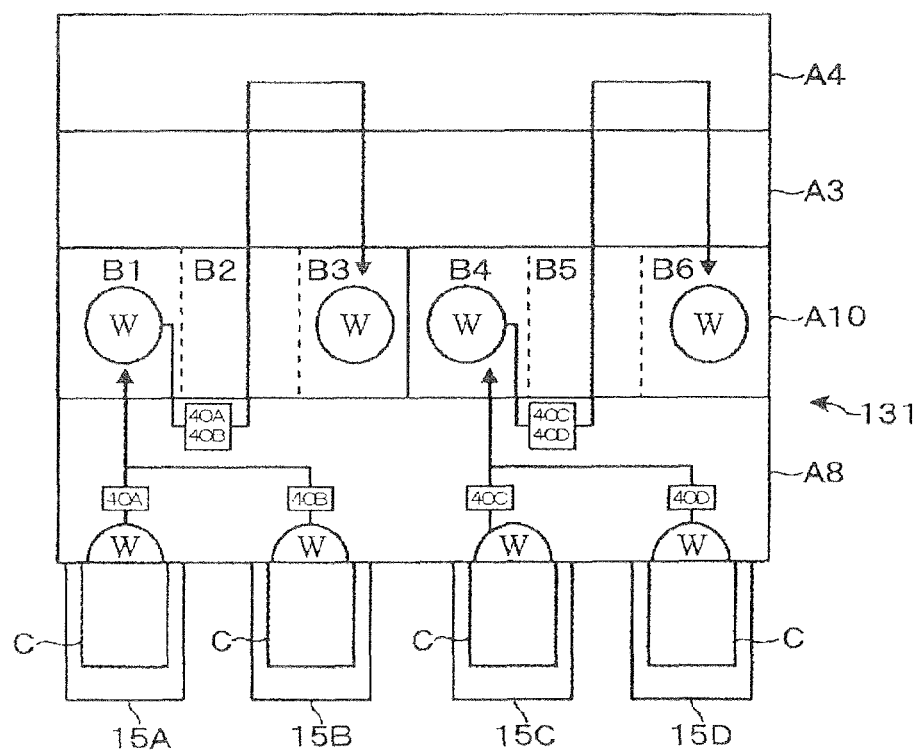
FIG. 32 is a schematic view of wafer transport paths in the coating and developing apparatus.

In the coating and developing apparatus 131, a wafer W is transported substantially similarly to the coating apparatus 121. Different points are described with reference to FIGS. 32 and 33. By means of the first holding arm 47, the transfer unit bodies 40A and 40B of the carrier block A8 discharge a wafer W from the carriers C on the carrier placement units 15A and 15B to the unit block B1 through the delivery module SCPL. Then, the second holding arm 48 of the transfer unit bodies 40A and 40B transports the wafer to the unit block B2, and a resist film and thereafter an upper antireflection film are formed on the wafer W. After that, the wafer W is loaded into the exposure apparatus A4 through the interface block A3, and then is loaded into the unit block B3 so as to be subjected to a developing process (FIG. 32).

Figure 33:
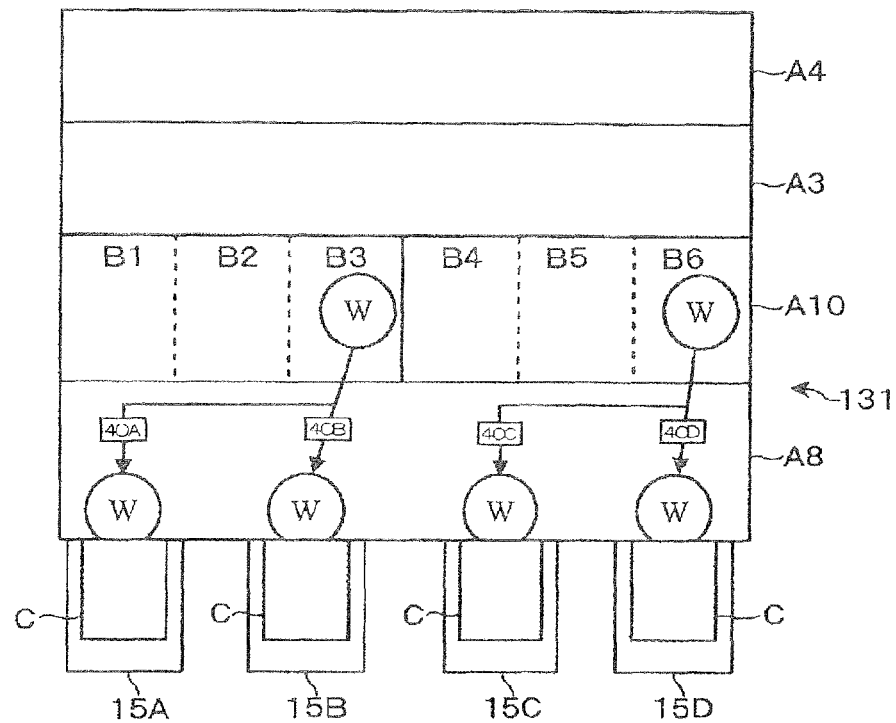
FIG. 33 is a schematic view of wafer transport paths in the coating and developing apparatus.

Then, the wafer W is returned to the carrier C by the first holding arm 47 of the transfer unit bodies 40A and 40B (FIG. 33).

Wafers W in the carriers C on the carrier placement units 15C and 15D are transported similarly to the wafers W discharged from the carriers C on the carrier placement units 15A and 15B, excluding that the transfer unit bodies 40C and 40D instead of the transfer unit bodies 40A and 40B are used for transporting the wafers, that the wafers W are processed in the unit blocks B4 to B6, and that the wafers W are transported to the delivery modules at heights corresponding to the unit blocks B4 to B6. In addition, similarly to the coating apparatus 121, in the coating and developing apparatus 131, the sender carrier SC may be placed on one of the carrier placement units 15A and 15B and the receiver carrier RC may be placed on the other. In addition, the sender carrier SC may be placed on one of the carrier placement units 15C and 15D and the receiver carrier RC may be disposed on the other. Such a coating and developing apparatus 131 can provide an effect similar to that of the coating and developing apparatus 1.

(Seventh Embodiment)

Figure 34:
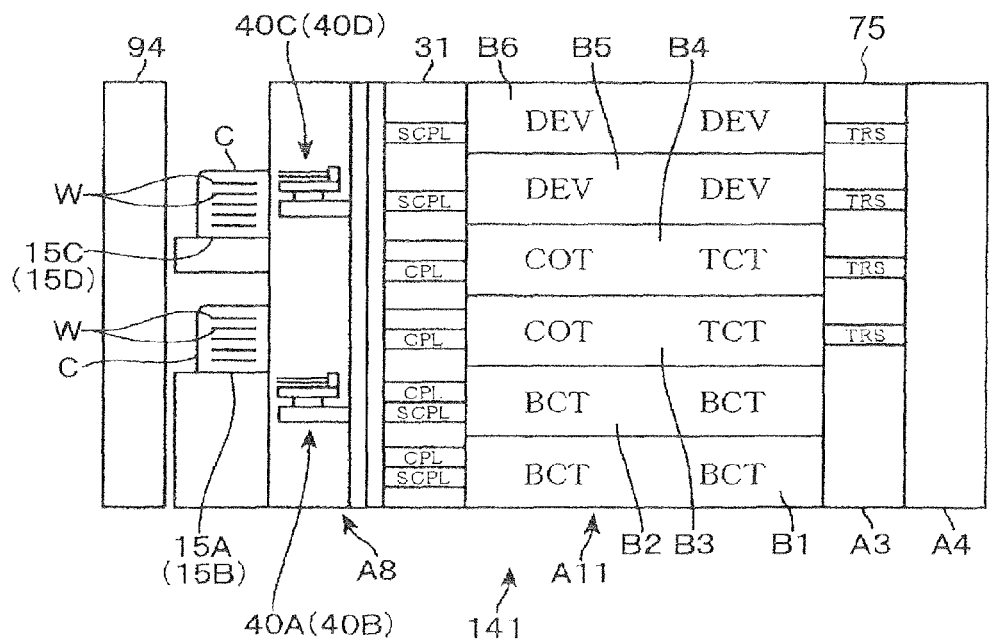
FIG. 34 is a schematic side view of a coating and developing apparatus in a seventh embodiment.

FIG. 34 shows a coating and developing apparatus 141. Differently from the coating and developing apparatus 131, unit blocks B12 and B2 constituting a processing block A11 include antireflection-film formation modules BCT, and unit blocks B3 and B4 include resist coating modules COT and upper antireflection-film formation modules TCT, respectively, and unit blocks B5 and B6 include developing modules DEV.

Figure 35:
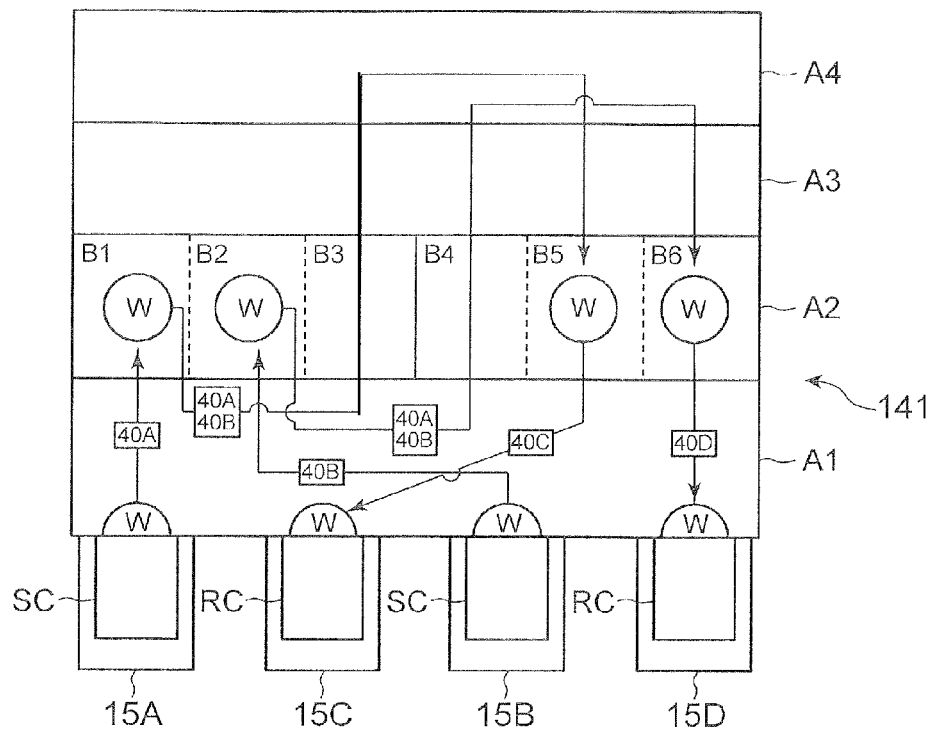
FIG. 35 is a schematic view of wafer transport paths in the coating and developing apparatus.

FIG. 35 shows transport paths of wafers W in the coating and developing apparatus 141. In this example, the sender carriers SC are placed on the carrier placement units 15A and 15B, and the receiver carriers RC are placed on the carrier placement units 15C and 15D. A wafer W in the sender carrier SC on the carrier placement unit 15A is sequentially processed in the unit blocks B1, B3 and B5, and is then sent to the receiver carrier RC on the carrier placement unit 15C. A wafer W in the sender carrier SC on the carrier placement unit 15B is sequentially processed in the unit blocks B2, B4 and B6, and is then sent to the receiver carrier RC on the carrier placement unit 15D.

A path of the wafer W transported from the sender carrier SC on the carrier placement unit 15A is further described. The wafer W is transported by the first holding arm 47 of the transfer unit body 40A to the delivery module SCPL of the tower unit 31 so as to be processed in the unit bock B1. Thereafter, the wafer W is transported by the second holding arm 48 of the transfer unit body 40A or the transfer unit body 40B to the delivery module SCPL so as to be transported to the unit block B3. After various kinds of films have been formed on a surface of the wafer W, the wafer W is transported to the exposure apparatus A4 so as to be exposed, similarly to the coating and developing apparatus 131. Thereafter, the wafer W is transported to the unit block B5 so as to be developed, and is then transported to the delivery module SCPL. After that, the wafer W is sent to the receiver carrier RC on the carrier placement unit 15C by the first holding arm 47 of the transfer unit body 40C.

The wafer W discharged from the sender carrier SC on the carrier placement unit 15B is transported similarly to the wafer W in the sender carrier SC on the carrier placement unit 15A, excluding that, when the wafer W is discharged from the carrier SC, the transfer unit body 40B is used instead of the transfer unit body 40A, that the wafer W is processed in the unit blocks B2, B4 and B6, that the wafer W is transported to the delivery modules at heights corresponding to the unit blocks B2, B4 and B6, and that, when the wafer W is transported to the receiver carrier RC, the transfer unit body 40D is used instead of the transfer unit body 40C. In this example, the wafer W is transported without using the second holding arm 48 of the transfer unit bodies 40C and 40D.

In the aforementioned embodiments, similarly to the first embodiment, wafers W discharged from one carrier C may be transported to different unit blocks, or the wafers W may be processed in the unit blocks having the same structure under different processing conditions. When a wafer W is transported between the sender carrier SC and the receiver carrier RC, until the wafer W is loaded into the delivery module for loading the wafer into the receiver carrier RC of the tower unit 31, the respective transfer unit bodies may be used separately for discharging a wafer W and for vertically moving and transporting the wafer W.

(Eighth Embodiment)

Figure 36:
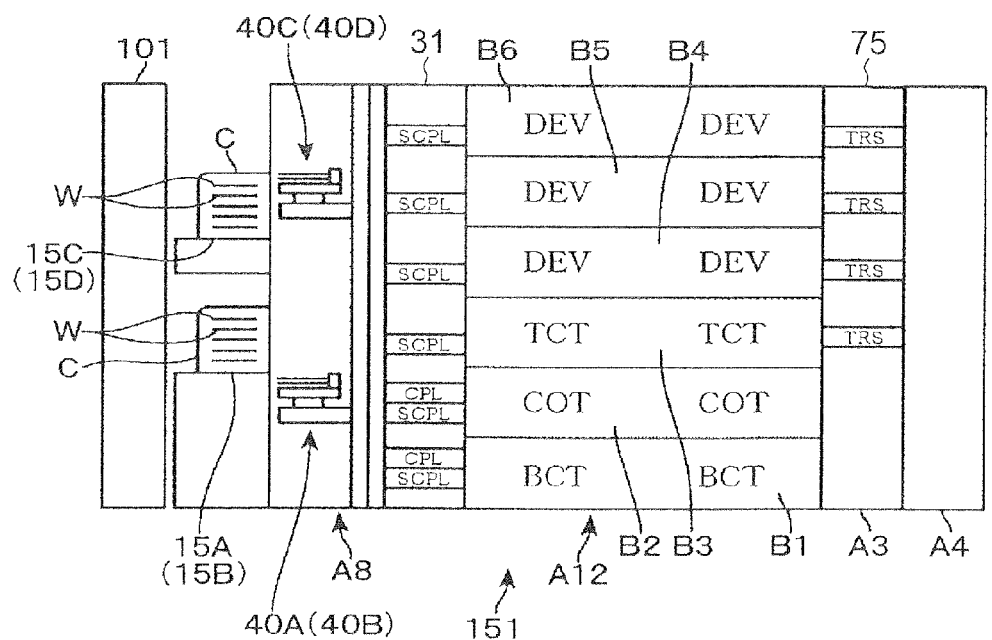
FIG. 36 is a schematic side view of a coating and developing apparatus in an eighth embodiment.

The structure of the processing block is not limited to the structure in which two unit blocks having the same structure are provided. For example, in a processing block A12 of a coating and developing apparatus 151 in FIG. 36, unit blocks B1, B2 and B3 include antireflection-film formation modules BCT, resist-film formation modules COT and upper antireflection-film formation modules TCT, respectively, and unit blocks B4, B5 and B6 include developing modules DEV. Wafers W having been discharged from the sender carriers SC on the carrier placement units 15A and 15B are transported to the first holding arm 47 of the transfer unit bodies 40A and 40B, the delivery module SCPL, the unit block B1, the delivery module CPL, the second holding arm 48 of the transfer body units 40A ad 40B, the delivery module SCPL, the unit block B2, the delivery module CPL, the second holding arm 48 of the transfer unit bodies 40A and 40B, the unit block B3 and the exposure apparatus 54, in this order. Thereafter, the wafers W are transported to one of the unit blocks B4 to B6, and then the wafers W are sent to the receiver carriers RC on the carrier placement units 15C and 15D by the first holding arm 47 of the transfer unit bodies 40C and 40D.

Also in the coating and developing apparatus 151, wafers W discharged from one carrier C may be sent to one of the unit blocks B4 to B6, or may be transported respectively to the unit blocks B4 to B6 in accordance with the order of the wafers discharged from the one carrier C. In the coating and developing apparatuses 141 and 151, the carriers C on the carrier placement units 15A and 15B, from which all the wafers have been discharged, may be moved to the carrier placement units 15C and 15D by the carrier replacement mechanism 101, and the processed wafers W may be accommodated in the carriers C moved thereto. In addition, the number of the stacked unit blocks is not limited to six, as long as the number is plural. The processing block A2 may be constituted by stacking only unit blocks for developing. In the fifth to eighth embodiments, not limited to the carrier block A8, the apparatus may be constituted by using a carrier block in which the upper and lower transfer unit bodies are applied to the aforementioned other carrier blocks of different structures, such as the carrier block A1.

What is claimed is:

1. A substrate processing apparatus comprising:
    a carrier block including a first carrier placement unit and a second carrier placement unit each for holding thereon a carrier capable of accommodating substrates, the first carrier placement unit and the second carrier placement unit being spaced apart from each other in a right and left direction;
    a processing block disposed on a rear side of the carrier block, the processing block having a layered structure in which layered parts configured to sequentially process a substrate are vertically arranged, and the layered parts each including a substrate transport mechanism configured to transport a substrate and a processing module configured to process a substrate;
    a tower unit located on a position between the first carrier placement unit and the second carrier placem ent unit. the tower unit including substrate placement units, each substrate placement unit being located at a height position where a substrate is transferred by the substrate transport mechanism of one layered part corresponding to the substrate placement unit;

a first substrate transfer mechanism configured to transfer a substrate between the carrier on the first carrier placement unit and the substrate placement unit of the tower unit, and between the two substrate placement units included in the tower unit; and a second substrate transfer mechanism configured to transfer a substrate between the carrier on the second carrier placement unit and the substrate placement unit of the tower unit, and between the two substrate placement units included in the tower unit;

wherein each of the first and second substrate transfer mechanism includes a first substrate holding member exclusively used when a substrate is transferred between the carrier and the substrate placement unit, and a second substrate holding member exclusively used when a substrate is transferred between the substrate placement units of the tower unit.

2. The substrate processing apparatus according to claim 1, wherein the first substrate holding member is configured to hold a substrate such that the first substrate holding member comes into contact with a portion nearer to a center of a lower surface of the substrate than a peripheral portion thereof;

the second substrate holding member includes a support portion disposed to surround at least a part of a circumference of a substrate, and a holding claw disposed on an inner peripheral edge of the support portion and configured to support a peripheral portion of a substrate from below; and the substrate placement unit to and from which a substrate is transferred by the second substrate holding member includes a placement plate for placing thereon a substrate, the placement plate having a cutout in an outer circumference thereof, through which the holding claw can pass.

3. The substrate processing apparatus according to claim 1, wherein the substrate placement unit to and from which a substrate is transferred by the first substrate holding member includes an elevating member configured to vertically move a substrate to a position that does not planarly interfere with the first substrate holding member, such that a substrate can be transferred between the substrate placement unit and the first substrate holding member.

4. A substrate processing method comprising:

in a substrate processing apparatus including: a carrier block in which a first carrier placement unit and second carrier placement unit are arranged, each carrier placement unit for holding thereon a carrier capable of accommodating substrates; a processing block disposed on a rear side of the carrier block, the processing block having a layered structure in which layered parts configured to sequentially process a substrate are vertically arranged, and the layered parts each including a substrate transport mechanism configured to transport a substrate and a processing module configured to process a substrate; a tower unit located on a position between the first carrier placement unit and the second carrier placement unit which are vaced.apart from each other in a right and left direction including substrate placement units, each substrate placement unit being located at a height position where a substrate is transferred by the substrate transport mechanism of one layered part corresponding to the substrate placement unit; and a first substrate transfer mechanism configured to transfer a substrate between the carrier on the first carrier placement unit and the substrate placement unit of the tower unit, and between the two substrate placement units included in the tower unit; and a second substrate transfer mechanism configured to transfer a substrate between the carrier on the second carrier placement unit and the substrate placement unit of the tower unit, and between the two substrate placement units included in the tower unit placing a carrier on the first carrier placement unit or on the second carrier placement unit;

taking out a substrate from the carrier one the first or second carrier placement unit so as to transfer the substrate to the substrate placement unit of the tower unit by means of a first substrate holding member of the corresponding substrate transfer mechanism of the first substrate transfer mechanism and the second substrate transfer mechanism;

receiving the substrate on the substrate placement unit so as to transport the substrate to the processing module by means of the corresponding substrate transport mechanism in the processing block, and processing the substrate in the processing module;

transporting the processed substrate to the substrate placement unit of the tower unit by means of the substrate transport mechanism;

receiving the substrate placed on the substrate placement unit so as to transfer the substrate to another substrate placement unit of the tower unit corresponding to a layered part where a succeeding process is performed, by means of a second holding member different from the first holding member of the first or second substrate transfer mechanism; and receiving the substrate on another substrate placement unit so as to transport the substrate to the processing module by means of the substrate transport mechanism of the layered part where the succeeding process is performed, and processing the substrate in the processing module.

5. The substrate processing method according to claim 4, wherein the first substrate holding member is configured to hold a substrate such that the first substrate holding member comes into contact with a portion nearer to a center of a lower surface of the substrate than a peripheral portion thereof;

the second substrate holding member includes a support portion disposed to surround at least a part of a circumference of a substrate, and a holding claw disposed on an inner peripheral edge of the support portion and configured to support a peripheral portion of a substrate from below; and the substrate placement unit to and from which a substrate is transferred by the second substrate holding member includes a placement plate for placing thereon a substrate, the placement plate having a cutout in an outer circumference thereof, through which the holding claw can pass.

6. The substrate processing method according to claim 4, wherein the substrate placement unit to and from which a substrate is transferred by the first substrate holding member includes an elevating member configured to vertically move a substrate to a position that does not planarly interfere with the first substrate holding member, such that a substrate can be transferred between the substrate placement unit and the first substrate holding member.

7. A nontransitory storage medium storing a computer program to be used in a substrate processing apparatus including: a carrier block in which a carrier capable of accommodating substrates is placed; a processing block having a layered structure in which layered parts configured to sequentially process a substrate are vertically arranged, the layered parts each including a substrate transport mechanism and a processing module configured to process a substrate; and a tower unit including substrate placement units, each substrate placement unit being located at a height position where a substrate is transferred by the substrate transport mechanism of one layered part corresponding to the substrate placement unit;

wherein the computer program is configured to execute the substrate processing method according to claim 4.

* * * * *